United States Patent
Shatalov et al.

(10) Patent No.: US 10,147,854 B2
(45) Date of Patent: Dec. 4, 2018

(54) PACKAGING FOR ULTRAVIOLET OPTOELECTRONIC DEVICE

(71) Applicant: Sensor Electronic Technology, Inc., Columbia, SC (US)

(72) Inventors: Maxim S. Shatalov, Columbia, SC (US); Saulius Smetona, Concord, NC (US); Alexander Dobrinsky, Loudonville, NY (US); Michael Shur, Latham, NY (US); Mikhail Gaevski, West Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/388,468

(22) Filed: Dec. 22, 2016

(65) Prior Publication Data
US 2017/0104138 A1    Apr. 13, 2017

Related U.S. Application Data

(63) Continuation-in-part of application No. 14/938,437, filed on Nov. 11, 2015, which is a
(Continued)

(51) Int. Cl.
*H01L 33/56*    (2010.01)
*H01L 33/48*    (2010.01)
(Continued)

(52) U.S. Cl.
CPC .............. *H01L 33/56* (2013.01); *H01L 24/97* (2013.01); *H01L 33/0095* (2013.01);
(Continued)

(58) Field of Classification Search
None
See application file for complete search history.

(56) References Cited

U.S. PATENT DOCUMENTS

| 5,635,115 A | 6/1997 | Konishi et al. |
| 6,921,929 B2 | 7/2005 | LeBoeuf et al. |

(Continued)

FOREIGN PATENT DOCUMENTS

| JP | 2012019062 A | 1/2012 |
| KR | 20080055549 A | 6/2008 |

(Continued)

OTHER PUBLICATIONS

Jackson, W.B., et al., "Large Area Flexible Electronics Fabricated Using Self-Aligned Imprint Lithography," The Electrochemical Society, 2007, 6 pages.

(Continued)

*Primary Examiner* — Khaja Ahmad
(74) *Attorney, Agent, or Firm* — LaBatt, LLC

(57) ABSTRACT

A solution for packaging an optoelectronic device using an ultraviolet transparent polymer is provided. The ultraviolet transparent polymer material can be placed adjacent to the optoelectronic device and/or a device package on which the optoelectronic device is mounted. Subsequently, the ultraviolet transparent polymer material can be processed to cause the ultraviolet transparent polymer material to adhere to the optoelectronic device and/or the device package. The ultraviolet transparent polymer can be adhered in a manner that protects the optoelectronic device from the ambient environment.

20 Claims, 27 Drawing Sheets

Related U.S. Application Data continuation-in-part of application No. 14/708,478, filed on May 11, 2015, now Pat. No. 9,548,429.

(60) Provisional application No. 61/991,464, filed on May 10, 2014, provisional application No. 62/040,817, filed on Aug. 22, 2014, provisional application No. 62/104,380, filed on Jan. 16, 2015, provisional application No. 62/153,055, filed on Apr. 27, 2015.

(51) Int. Cl.
| | |
|---|---|
| *H01L 33/50* | (2010.01) |
| *H01L 33/58* | (2010.01) |
| *H01L 23/00* | (2006.01) |
| *H01L 33/00* | (2010.01) |
| *G02B 3/00* | (2006.01) |
| *G02B 6/42* | (2006.01) |
| *B29L 31/00* | (2006.01) |
| *B29L 31/34* | (2006.01) |
| *B29C 51/12* | (2006.01) |

(52) U.S. Cl.
CPC .............. *H01L 33/58* (2013.01); *B29C 51/12* (2013.01); *B29L 2031/3481* (2013.01); *B29L 2031/747* (2013.01); *G02B 3/005* (2013.01); *G02B 6/4249* (2013.01); *H01L 2224/14* (2013.01); *H01L 2933/005* (2013.01); *H01L 2933/0041* (2013.01); *H01L 2933/0058* (2013.01)

(56) References Cited

U.S. PATENT DOCUMENTS

| | | | | |
|---|---|---|---|---|
| 9,548,429 | B2 | 1/2017 | Shatalov et al. | |
| 2003/0219207 | A1* | 11/2003 | Guy | A61B 1/07 385/49 |
| 2003/0230977 | A1 | 12/2003 | Epstein | |
| 2004/0184270 | A1 | 9/2004 | Halter | |
| 2004/0246744 | A1* | 12/2004 | Krupa | G02B 6/0006 362/574 |
| 2005/0006651 | A1* | 1/2005 | LeBoeuf | H01L 33/502 257/79 |
| 2005/0062412 | A1 | 3/2005 | Taniguchi et al. | |
| 2006/0001046 | A1 | 1/2006 | Batres et al. | |
| 2006/0138443 | A1 | 6/2006 | Fan et al. | |
| 2006/0152820 | A1* | 7/2006 | Lien | F21V 5/04 359/726 |
| 2007/0153545 | A1* | 7/2007 | Lee | G02B 6/0073 362/610 |
| 2007/0264739 | A1* | 11/2007 | Chew | H01L 33/52 438/46 |
| 2011/0212334 | A1 | 9/2011 | Jolley et al. | |
| 2011/0215342 | A1 | 9/2011 | Oliver | |
| 2012/0119221 | A1* | 5/2012 | Negley | H01L 33/58 257/76 |
| 2013/0078411 | A1 | 3/2013 | Gaska et al. | |
| 2013/0119424 | A1* | 5/2013 | Kang | H01L 33/20 257/98 |
| 2013/0119426 | A1 | 5/2013 | Katoh et al. | |
| 2014/0021503 | A1 | 1/2014 | Yoshida et al. | |
| 2016/0064631 | A1 | 3/2016 | Shatalov et al. | |

FOREIGN PATENT DOCUMENTS

| | | |
|---|---|---|
| KR | 20110034072 A | 4/2011 |
| WO | 2013006616 A1 | 1/2013 |

OTHER PUBLICATIONS

AGC Chemicals Europe, Ltd., "F-Clean," Copyright 2015, 1 page.
AGC Chemicals Europe, Ltd., "Fluon ETFE Film," Copyright 2016, 1 page.
Daikin Industries, Ltd., "Product Overview: Daikin Fluorochemical Products," http://www.daikin.co.jp/chm, Copyright 2016, pp. 1-4.
Teng, H., "Overview of the Development of the Fluoropolymer Industry," Applied Sciences, vol. 2, No. 4, pp. 496-512, May 2012.
Ahmad, K., U.S. Appl. No. 14/938,437, Non-Final Rejection, dated Jul. 29, 2016, 25 pages.
Ahmad, K., U.S. Appl. No. 14/708,478, Notice of Allowance, dated Sep. 13, 2016, 16 pages.
Ahmad, K., U.S. Appl. No. 14/708,478, Non-Final Rejection, dated Apr. 21, 2016, 24 pages.
Park, H., International Application No. PCT/US2015/030075, Interntaional Search Report, dated Jul. 28, 2015, 3 pages.
Ahmad, K., U.S. Appl. No. 14/938,437, Final Rejection, dated Dec. 19, 2016, 25 pages.
Ahmad, K., U.S. Appl. No. 14/938,437, Non-Final Rejection2, dated Apr. 6, 2017, 5 pages.

* cited by examiner

PACKAGING FOR ULTRAVIOLET OPTOELECTRONIC DEVICE

REFERENCE TO RELATED APPLICATIONS

The present patent application is a continuation-in-part of U.S. application Ser. No. 14/938,437, entitled "Packaging for Ultraviolet Optoelectronic Device," which was filed on 11 Nov. 2015, which is a continuation-in-part application of U.S. patent application Ser. No. 14/708,478, entitled "Packaging for Ultraviolet Optoelectronic Device," which was filed on 11 May 2015, which claims the benefit of: U.S. Provisional Application No. 61/991,464, which was filed on 10 May 2014; U.S. Provisional Application No. 62/040,817, which was filed on 22 Aug. 2014; U.S. Provisional Application No. 62/104,380, which was filed on 16 Jan. 2015; and U.S. Provisional Application No. 62/153,055, which was filed on 27 Apr. 2015, each of which is hereby incorporated by reference in its entirety to provide continuity of disclosure.

TECHNICAL FIELD

The disclosure relates generally to ultraviolet light emitting devices, and more particularly, to an encapsulant for ultraviolet light emitting devices.

BACKGROUND ART

Due to recent advances in group III-based ultraviolet (UV) light emitting diode (LED) technology, interest in using UV LEDs for various applications, such as disinfection of medical tools, water purification, fluorescence spectroscopy, medical therapy, and the like, is increasing. In order to successfully utilize such devices, they need to be packaged and isolated from interaction with the outside environment to protect the electrical components of these devices. In addition, packaging solutions can provide a way to improve light extraction efficiency. For example, one approach for improving light extraction uses an index matching encapsulant (e.g., similar to the approach used for visible LEDs) in order to decrease the total internal reflection (TIR) from the device surfaces and, as a result, extract more light from the UV LED.

Typical epoxy resin materials used for visible LED encapsulation are not adequate for UV LEDs as the resins are not sufficiently transparent to UV radiation and quickly deteriorate under the UV radiation. An ideal encapsulant should be "stable." In particular, the optical and physical properties of the encapsulant should not change during packaging, LED assembly, and during the operating lifetime of the LED. For example, an encapsulant should be resistant to heating during the LED assembly, such as during soldering a chip onto a printed circuit board or during a curing process. During the curing process, drying of the encapsulant can further induce stresses in the material. As a result, an encapsulant that is not prone to crack during the curing procedure can be selected.

Recently, UV transparent, and partially UV transparent fluoropolymers have become important materials for UV applications and can serve as moldable encapsulants for optoelectronic devices. For instance, one approach discloses materials and methods used to package and encapsulate UV and deep UV (DUV) LEDs having emission wavelengths from around 360 nm to around 200 nm. The UV/DUV LED die, or its flip-chip bonded subassembly, are disposed in a low thermal resistance packaging house. Either the whole package or just the UV/DUV LED is globed with a UV/DUV transparent dome-shape encapsulation. This protects the device, enhances light extraction, and focuses the light emitted.

SUMMARY OF THE INVENTION

This Summary Of The Invention introduces a selection of certain concepts in a brief form that are further described below in the Detail Description Of The Invention. It is not intended to exclusively identify key features or essential features of the claimed subject matter set forth in the Claims, nor is it intended as an aid in determining the scope of the claimed subject matter.

The inventors of the present patent application recognize a need to improve a technique for encapsulation specific to fluoropolymers. For example, the above application that discusses encapsulation using transparent polymers, does not take into account the fact that fluoropolymers, while being moldable at about melting temperature, cannot easily fill the voids and be fluid like. The disclosure describes in one embodiment that a dome-shape encapsulation that includes an optically transparent Poly(methyl methacrylate) (PMMA). Fluorinated polymers or other organic materials can be used to fill the voids and be fluid like. In another embodiment, a lens made from sapphire, fused silica, or other transparent materials can be applied to an encapsulate or the optoelectronic device itself to obtain a seal from an ambient environment.

Accordingly, aspects of the invention provide a solution for packaging an optoelectronic device using an ultraviolet transparent polymer. The ultraviolet transparent polymer material can be placed adjacent to the optoelectronic device and/or a device package on which the optoelectronic device is mounted. Subsequently, the ultraviolet transparent polymer material can be processed to cause the ultraviolet transparent polymer material to adhere to the optoelectronic device and/or the device package. The ultraviolet transparent polymer can be adhered in a manner that protects the optoelectronic device from the ambient environment.

A first aspect of the invention provides a method of packaging a set of optoelectronic devices mounted on a device package, the method comprising: placing an ultraviolet transparent polymer material across each of the optoelectronic devices in the set of optoelectronic devices; and encapsulating the set of optoelectronic devices with the ultraviolet transparent polymer material, wherein the ultraviolet transparent polymer material substantially fills any voids present on a surface of each of the set of optoelectronic devices, and wherein the ultraviolet transparent polymer material and the device package seal a portion of each of the set of optoelectronic devices from an ambient environment.

A second aspect of the invention provides a method of packaging an optoelectronic device, the method comprising: mounting the optoelectronic device onto a device package; placing an ultraviolet transparent polymer film across the optoelectronic device; encapsulating the optoelectronic device with the ultraviolet transparent polymer film, wherein the ultraviolet transparent polymer film substantially fills any voids present on a surface of the optoelectronic device, and wherein the ultraviolet transparent polymer film and the device package seal a portion of the optoelectronic device from an ambient environment.

A third aspect of the invention provides a method of packaging an optoelectronic device, the method comprising: placing an ultraviolet transparent polymer film across a device package on which an optoelectronic device is mounted; and encapsulating the optoelectronic device with the ultraviolet transparent polymer film, wherein the ultraviolet transparent polymer film substantially fills any voids present on a surface of the optoelectronic device, and wherein the ultraviolet transparent polymer film and the device package seal a portion of the optoelectronic device from an ambient environment; wherein the encapsulating includes: heating the film to become flowable; monitoring the film to determine when the film has flowed sufficiently; applying a pressure to the film and the device package after sufficient flow has occurred; and allowing the film to cure.

A fourth aspect of the invention provides a method of packaging a set of optoelectronic devices, the method comprising: obtaining a device package including the set of optoelectronic devices; placing an ultraviolet transparent polymer material adjacent to each optoelectronic device in the set of optoelectronic devices; processing the ultraviolet transparent polymer material to seal each optoelectronic device in the set of optoelectronic devices from an ambient environment; and attaching a wave guiding structure over the ultraviolet transparent polymer material.

Aspect of the invention provides an optoelectronic device, comprising: a device package having a cavity formed therein; an optoelectronic component mounted within the cavity of the device package; an ultraviolet transparent polymer material formed over the optoelectronic component and the device package, the ultraviolet transparent polymer material extending over the optoelectronic component and the device package, wherein the ultraviolet transparent polymer material contacts only a top surface of the optoelectronic component and only a top surface of the device package that surrounds the optoelectronic component, the ultraviolet transparent polymer material sealing the optoelectronic component and the cavity from an ambient environment; and a wave guiding structure formed over the ultraviolet transparent polymer material and the device package, wherein the wave guiding structure includes at least one of: a lens, an optical fiber, or an ultraviolet transparent wave guiding structure.

Aspect of the invention provides an optoelectronic device, comprising: a device package having a cavity formed therein with a bottom surface and a pair of opposing side walls extending upward from the bottom surface; an optoelectronic component mounted within the cavity of the device package on the bottom surface; a pair of reflectance domains, each reflectance domain formed on one of the opposing side walls of the cavity, wherein each reflectance domain comprises one of: a spectral reflectance domain or a diffusive reflectance domain; a plurality of ultraviolet transparent polymer layers formed over the optoelectronic component and the device package, wherein at least one of the plurality of ultraviolet transparent polymer layers extends along the pair of reflectance domains, the bottom surface of the cavity, and all side and top surfaces of the optoelectronic component to form a seal from an ambient environment; and at least one domain formed in at least one of the plurality of ultraviolet transparent polymer layers, the at least one domain comprising one of: a transparent domain formed of a transparent material having diffusive properties or a fluorescent domain formed of a fluorescent material that visibly fluoresces under exposure to ultraviolet radiation.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 4A shows a transparent polymer film being applied to a structure, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
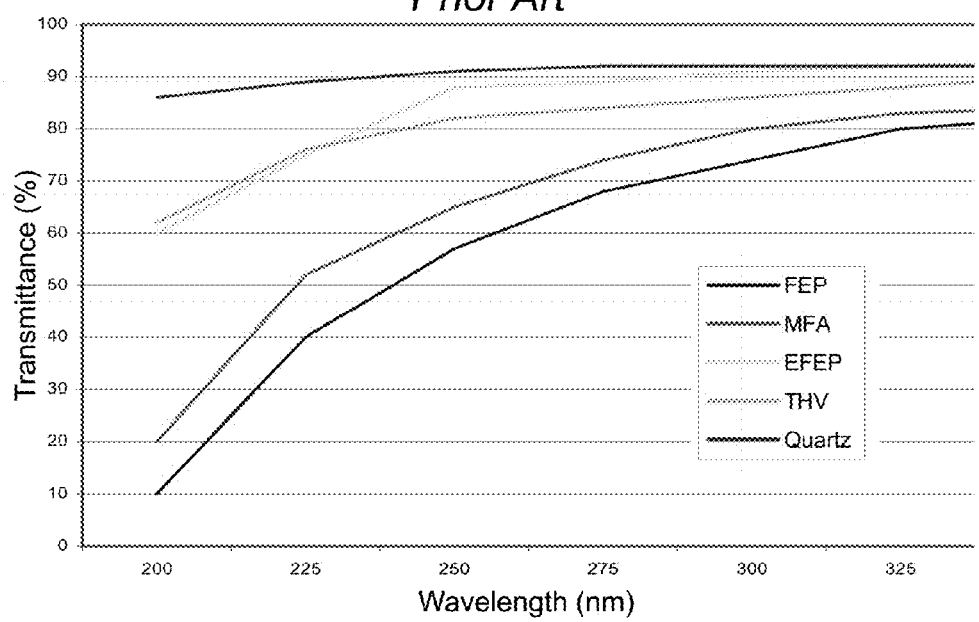
FIGS. 1A-1F show optical transmittance as a function of wavelength for various fluoropolymers as shown in the prior art.
Figure 1B:
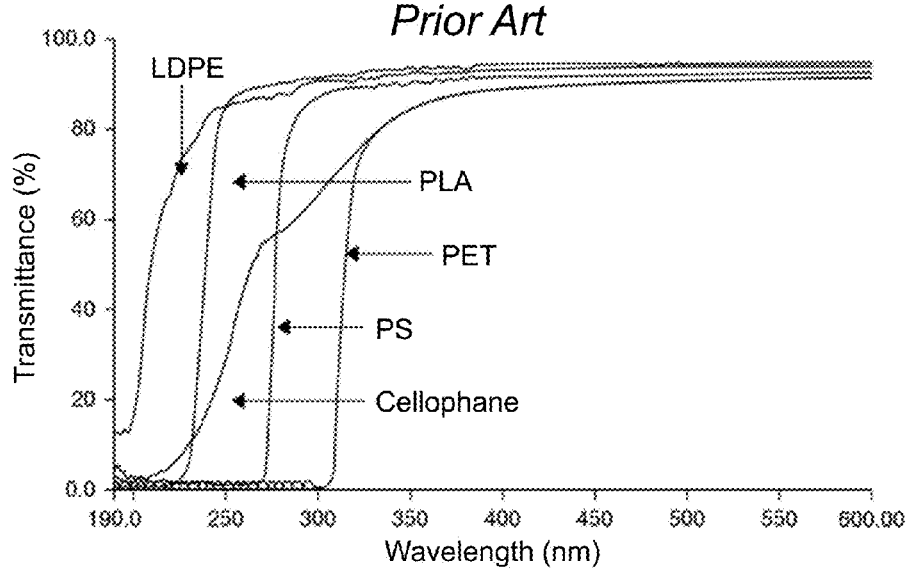
Figure 1C:
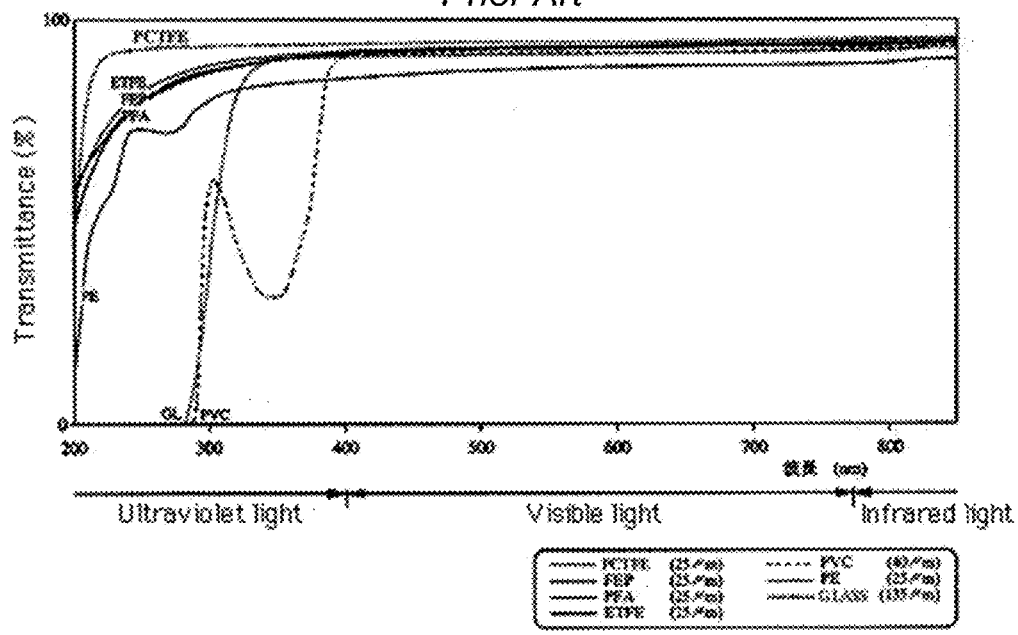
Figure 1D:
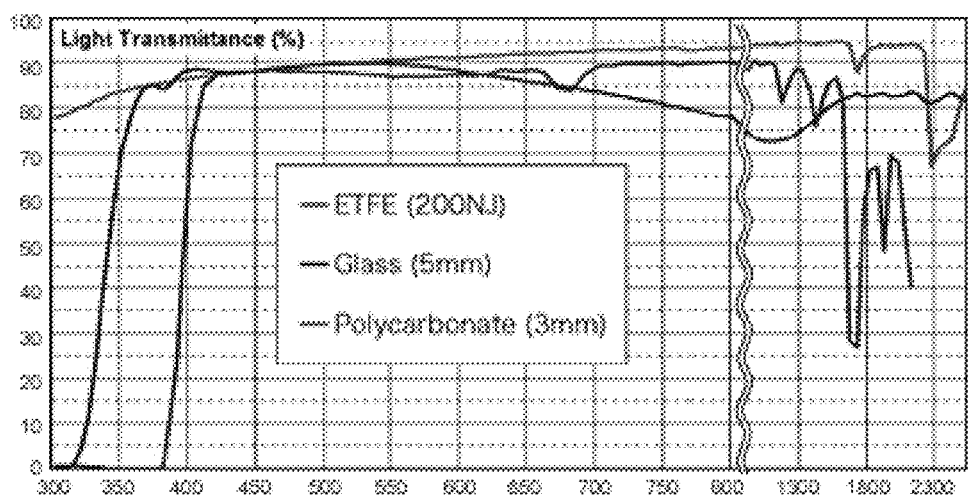

As indicated above, aspects of the invention provide a solution for packaging an optoelectronic device using an ultraviolet transparent polymer. The ultraviolet transparent polymer material can be placed adjacent to the optoelectronic device and/or a device package on which the optoelectronic device is mounted. Subsequently, the ultraviolet transparent polymer material can be processed to cause the ultraviolet transparent polymer material to adhere to the optoelectronic device and/or the device package. The ultraviolet transparent polymer can be adhered in a manner that protects the optoelectronic device from the ambient environment. To this extent, the resulting packaged optoelectronic device can have one or more benefits over prior art solutions including, for example, a comparable operating lifetime for different ambient environments (e.g., water, a high humidity environment, air, etc.).

As used herein, unless otherwise noted, the term "set" means one or more (i.e., at least one) and the phrase "any solution" means any now known or later developed solution. As also used herein, a layer is a transparent layer when the layer allows at least thirty percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent). It is understood that, unless otherwise specified, each value is approximate and each range of values included herein is inclusive of the end values defining the range.

Embodiments are directed to the use of a fluoropolymer in packaging of an optoelectronic device. A listing of illustrative fluoropolymers follows. However, it is understood that this listing is not inclusive and other fluoropolymers, including silicon-based polymers, quartz, cellophane, and/or the like, can be utilized. FIGS. 1A-1F show optical transmittance as a function of wavelength for various fluoropolymers as shown in the prior art. As illustrated, these polymers are transparent to at least a portion of radiation in the wavelength range of 200-380 nanometers. Furthermore, some of these polymers are highly transparent (e.g., have a transmission of at least eighty percent for a thin film (e.g., 200 microns or less)) for at least a portion of ultraviolet radiation.

Polytetrafluoroethylene (PTFE) is a polymer including recurring tetrafluoroethylene monomer units whose formula is $[CF_2-CF_2]_n$. PTFE does not melt to form a liquid and cannot be melt extruded. On heating the virgin resin, it forms a clear, coalescent gel at 626° F.±18° (330° C.±15°). Once processed, the gel point (often referred to as the melting point) is 18° F. (10° C.) lower than that of the virgin resin. PTFE is generally sold as a granular powder, a fine powder, or an aqueous dispersion. Each is processed in a different manner.

Fluorinated ethylene propylene (FEP) resin is a copolymer of tetrafluoroethylene and hexafluoropropylene with the formula $[(CF(CF_3)-CF_2)x(CF_2-CF_2)_y]_n$. FEP has a melting point range of 473°-536° F. (245°-280° C.) and is melt processible. FEP is supplied in the form of translucent pellets, powder, or as an aqueous dispersion.

Ethylene chlorotrifluoroethylene (ECTFE) is a copolymer of ethylene and chlorotrifluoroethylene having the formula $[(CH_2-CH_2)_x-(CFCl-CF_2)_y]_n$. ECTFE has a melting point range of 428°-473° F. (220°-245° C.) and is melt processible. ECTFE is available in the form of translucent pellets and as a fine powder.

Polychlorotrifluoroethene (PCTFE) is a polymer of chlorotrifluoroethylene with the formula $[CF_2-CFCl]_n$. PCTFE has a melting point range of 410°-428° F. (210°-220° C.) and is melt processible. PCTFE is available in pellet, granular and powder form.

Perfluoroalkoxy alkanes (PFA) resins are copolymers of TFE fluorocarbon monomers containing perfluoroalkoxy side chains. PFA melts at 536° F. (280° C.) minimum and is melt processible. PFA is available in the form of pellets, powder, and as an aqueous dispersion.

Polyvinylidene difluoride (PVDF) is a homopolymer of vinylidene fluoride having the formula $[CH_2-CF_2]n$ or a copolymer of vinylidene fluoride and hexafluoropropylene having the formula $[CF(CF_3)-CF_2)_x(CH_2-CF_2)_y]_n$. Copolymers of vinylidene fluoride are also produced with (1) chlorotrifluoroethylene, (2) tetrafluoroethylene, and (3) tetrafluoroethylene and hexafluoropropylene. These are all sold as PVDF copolymers. PVDF polymers/copolymers melt at 194°-352° F. (90°-178° C.), are melt processible, and are supplied in the form of powder, pellets, and dispersions.

Figure 1E:
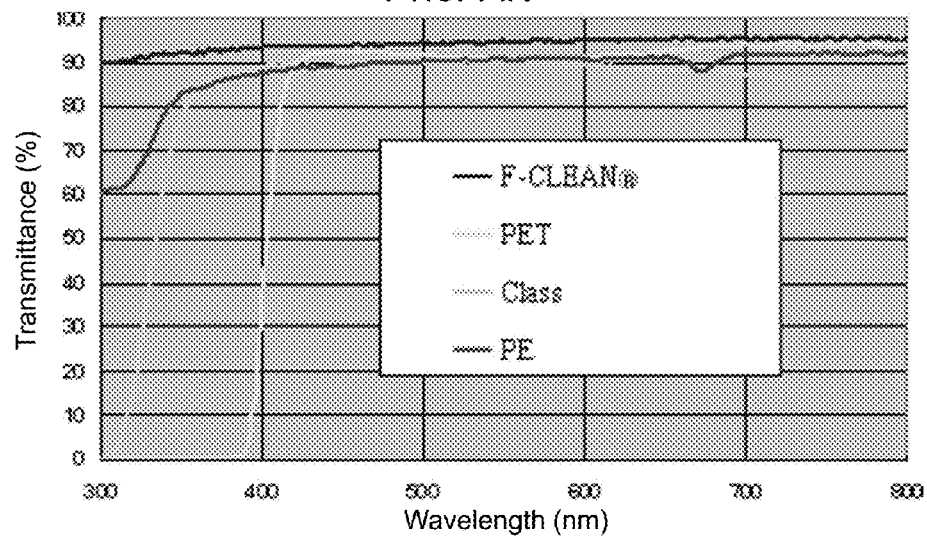
Figure 1F:
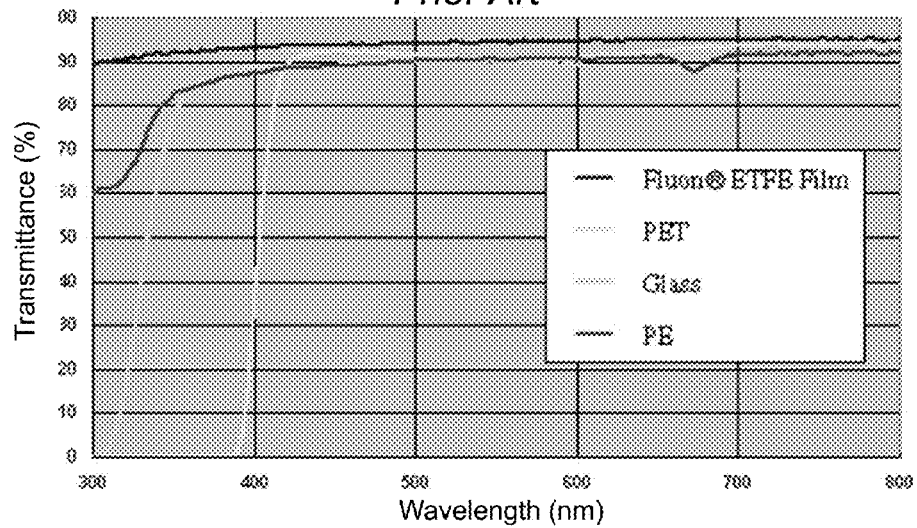

Ethylene tetrafluoroethylene (ETFE) is a copolymer of ethylene and tetrafluoroethylene of the formula $[(CF_2-CF_2)_x-(CH_2-CH_2)_y]_n$. ETFE melts at 428° F. (220° C.) minimum. ETFE is melt processible and is supplied in pellet and powder form. A fluorine based plastic, ETFE (ethylene tetrafluoroethylene) offers impressive corrosion resistance and strength over a very wide temperature range. Since ETFE is melt processible, it can be utilized in a vast range of applications. FIGS. 1E and 1F show optical transmittance as a function of wavelength for two illustrative brands of ETFE, F-CLEAN® and Fluon® ETFE offered by AGCCE Chemicals Europe, Ltd. As can be seen, ETFE has a high transparency even for ultraviolet light in the high wavelength range.

MFA is a copolymer of tetrafluoroethylene and perfluoromethylvinylether. MFA belongs to the generic class of PFA polymers. MFA melts at 536°-554° F. (280°-290° C.). MFA is available in the form of translucent pellets and aqueous dispersions.

Ethylene tetrafluoroethylene hexafluoropropylene fluoroterpolymer (EFEP) is a copolymer of ethylene, tetrafluoroethylene, and hexafluoropropylene with the formula $[(CH_2—CH_2)x(CF_2—CF_2)_y(CF(CF_3)—CF_2)_z]_n$. EFEP polymers melt at 311°-464° F. (155-240° C.), are melt processable, and are supplied in pellet form.

THV is a copolymer containing tetrafluoroethylene, hexafluoropropylene and vinylidenefluoride. THV is melt-processable with melting points from 240° to 455° F. (115° to 235° C.) depending on grade. THV is available in pellet, agglomerate or aqueous dispersions.

HTE is a copolymer of hexafluoropropylene, tetrafluoroethylene, and ethylene. HTE is melt processable with melting points from 310° to 420° F. (155° to 215° C.) depending on grade, and is available in pellet or agglomerate form.

Figure 2A:
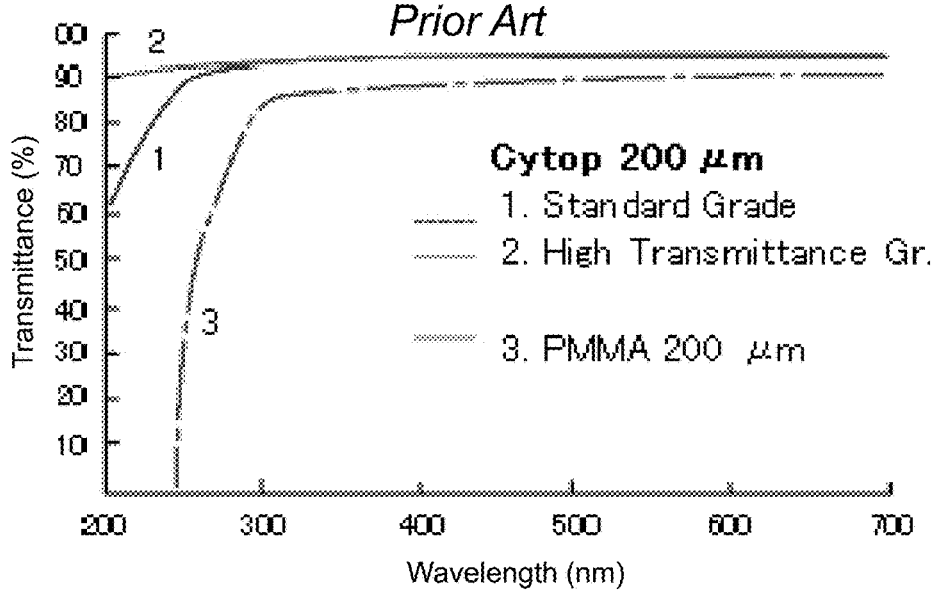
FIGS. 2A and 2B show optical transmittance as a function of wavelength for Cytop® and Teflon® AF, respectively, as shown in the prior art.
Figure 2B:
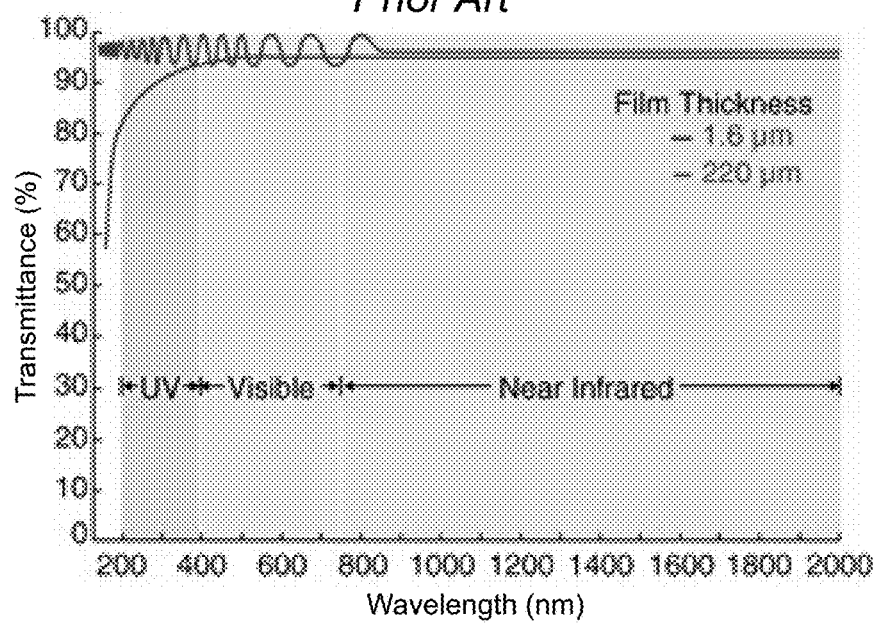

Some illustrative fluoropolymers are marketed under the brand names Teflon® AF (an amorphous fluoroplastic) offered by E. I. du Pont de Nemours and Company and Cytop® (an amorphous fluoropolymer) offered by Bellex International Corporation, which are currently sold as liquid solutions or gels. FIGS. 2A and 2B show optical transmittance as a function of wavelength for Cytop® and Teflon® AF, respectively, as shown in the prior art.

An embodiment utilizes an ultraviolet transparent fluoropolymer, such as one of the fluoropolymers discussed herein, in packaging an optoelectronic device. In a more specific embodiment, the optoelectronic device operates at a peak ultraviolet wavelength (referred to as an ultraviolet (UV) optoelectronic device). Several important factors for materials utilized in packaging an ultraviolet optoelectronic device include: transparency to ultraviolet radiation; stability to exposure to ultraviolet radiation, which can translate into a long operating lifetime for the material and the device without significant changes in optical, mechanical or chemical properties; a capability to protect the device from the environment, which can include mechanical dexterity and chemical inertness; and adhesion to surfaces of the optoelectronic device. In a more specific embodiment, a highly ultraviolet transparent fluoropolymer is utilized in the packaging. Such polymers are available and have a long lifetime when exposed to ultraviolet light.

However, it is understood that aspects of the invention are not limited to any particular material or group of materials listed herein. To this extent, numerous other materials or their combinations and solutions exist which can have appropriate properties and be utilized as described herein. For example, various polymers can be mixed, and various additional compounds can be added to the polymers (primarily when in the melted stage) to alter their mechanical, thermal, chemical and/or optical properties. In a specific example, a combination of several polymers can be utilized to improve adhesive properties of the solution.

In general, embodiments of the invention can be directed to any of various types of optoelectronic devices. For example, the optoelectronic device can be configured to operate as an emitting device, such as a light emitting diode (LED) or a laser diode (LD), a photo-multiplier, and/or as a light sensing device, such as a photodetector. The electromagnetic radiation emitted and/or sensed by the optoelectronic device can have a peak wavelength within any range of wavelengths, including visible light, ultraviolet radiation, deep ultraviolet radiation, infrared light, and/or the like. In an embodiment, the optoelectronic device is configured to emit and/or sense radiation having a dominant wavelength within the ultraviolet range of wavelengths. In another illustrative embodiment, the optoelectronic device operates in a spectral range from approximately 200 nanometers to approximately 400 nanometers.

A typical optoelectronic device includes a light emitting/sensing semiconductor heterostructure comprising: an n-type contact layer; a light generating/sensing structure having a first side adjacent to the n-type contact layer. The light generating/sensing structure can include a set of quantum wells and barriers. In addition, the heterostructure can include a p-type contact layer adjacent to the second side of the light generating/sensing structure. The p-type contact layer can be, for example, a semiconductor laminate structure. The entire structure can comprise group III nitride-based semiconductor layers of $Al_xB_yIn_zGa_{1-x-y-z}N$ composition (where $0 \le x,y,z \le 1$ and $x+y+z \le 1$), where, in general, molar fractions of all elements can vary from zero to one. An illustrative group III nitride-based p-type semiconductor laminate structure can include: an AlGaN electronic blocking layer with a high molar fraction of aluminum; an AlGaN grading layer or AlxGa1-xN/AlyGa1-yN superlattice; a set of GaN layers; p-GaN heavily doped layers; and/or the like. Regardless, an optoelectronic device can be fabricated by etching part of a p-contact and light generating structure to access the n-type contact layer. The n-type contact layer can be contacted with a n-type electrode. The device can be flip chip mounted on a submount. The submount, can be positioned inside a device package that can be mounted on a board capable of delivering power to operate the optoelectronic device.

Figure 3A:
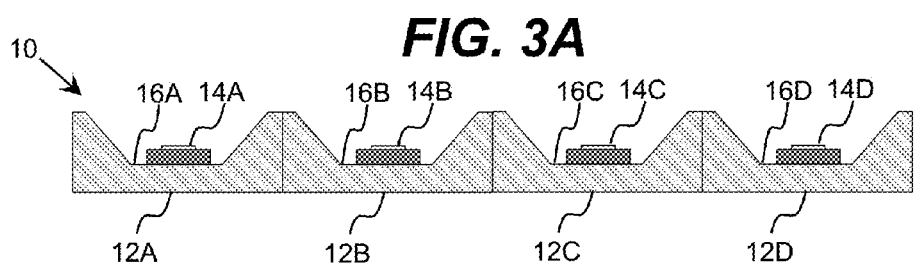
FIGS. 3A-3D show an illustrative packaging solution according to an embodiment.

FIGS. 3A-3D show an illustrative packaging solution according to an embodiment. As illustrated in FIG. 3A, a structure 10 can include an array of device packages 12A-12D arranged, for example, in a two-dimensional array. A plurality of optoelectronic devices 14A-14D can be surface mounted on a bottom surface 16A-16D of a three-dimensional depression on a surface of each device package 12A-12D. Each three-dimensional depression can form reflective sidewalls around the corresponding optoelectronic device 14A-14D. In an illustrative embodiment, the structure 10 is formed of a ceramic having at least an electrically insulating surface. Any of numerous insulating (e.g., dielectric) materials can be utilized. Illustrative materials include materials suitable for fabricating printed circuit boards (PCBs) including various pre-preg materials. More particular illustrative materials include: polytetrafluoroethylene (Teflon); materials formed of a resin (e.g., epoxy, polyester, phenolic, or the like) with a reinforcement (e.g., paper, woven glass, non-woven glass, or the like), such as, FR-1, FR-2, FR-3, FR-4, FR-5, FR-6, G-10, or the like; composite epoxy materials, such as, CEM-1, CEM-2, CEM-3, CEM-4, CEM-5, or the like; and/or the like.

In an embodiment, each device package 12A-12D can be formed of an ultraviolet transparent material, such as a fluoropolymer discussed herein. In this case, the sidewalls of each three-dimensional depression can have a different shape. Furthermore, when the material is a fluoropolymer discussed herein, the optoelectronic device 14A-14D can be mounted to the device package 12A-12D using a procedure described herein. In another embodiment, the array of device packages 12A-12D comprises a board, such as a printed circuit board, which includes device(s) and connection(s) capable of delivering power to the set of optoelectronic device 14A-14D (e.g., the n-type and p-type electrodes of each optoelectronic device 14A-14D).

Figure 3B:
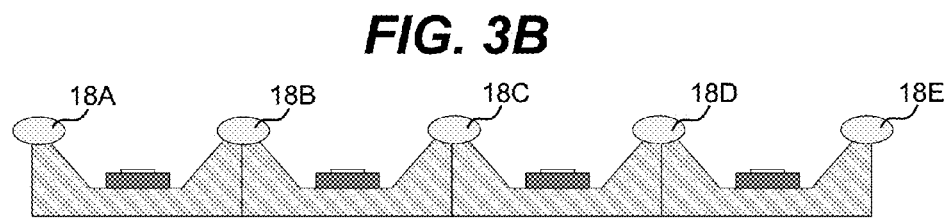
Figure 4A:
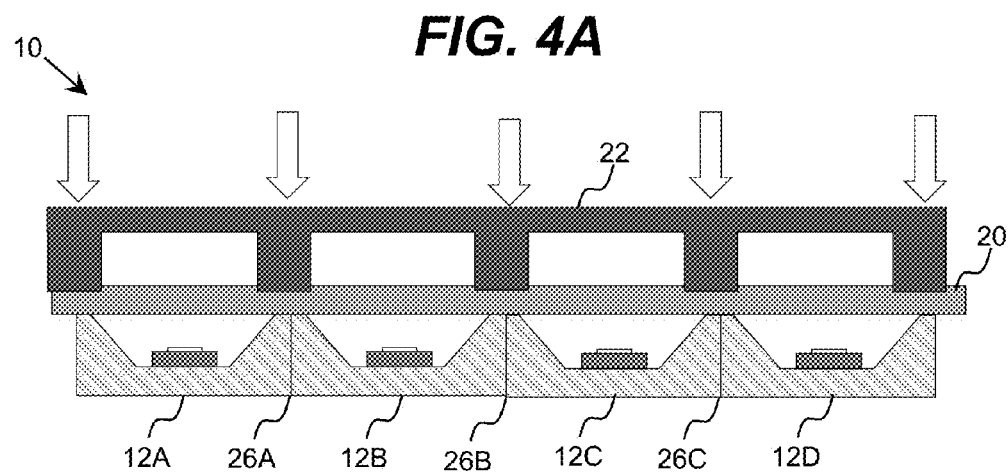
Figure 4B:
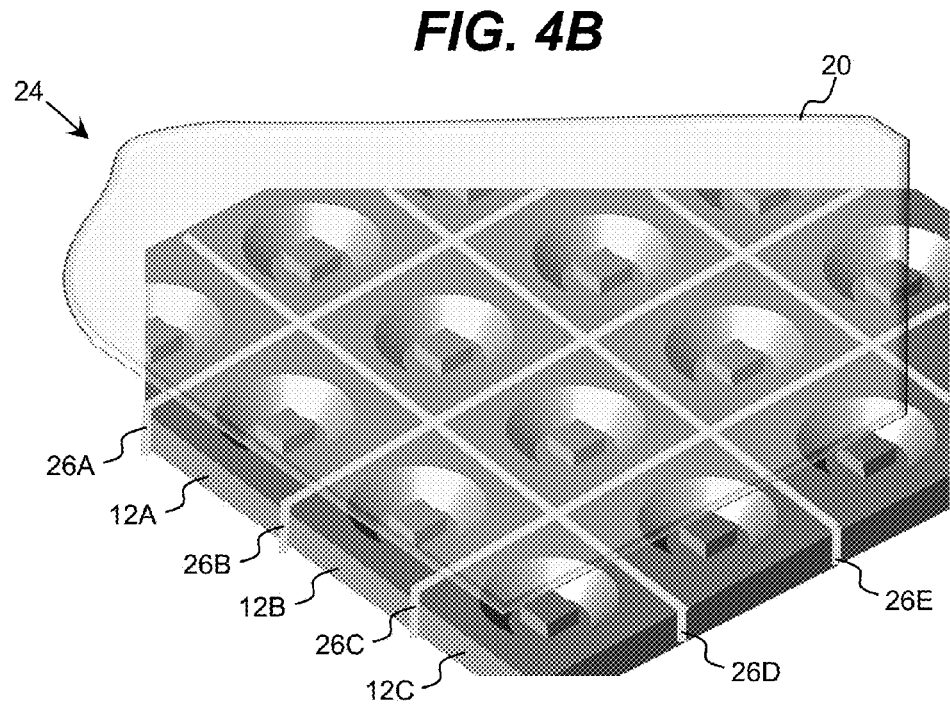
FIG. 4B shows a three-dimensional view of the resulting assembly according to an embodiment.

In FIG. 3B, an adhesive material 18A-18D can be applied to the topmost surface of the structure 10 at the junctions of adjacent device packages 12A-12D using any solution. The adhesive material 18A-18D can be any of various forms and materials of glues and adhesives. When the device packages 12A-12D are arranged in an array (e.g., as shown in FIG. 4B), the adhesive material 18A-18D can be long stripes of an adhesive material running along the edges between the adjacent device packages 12A-12D. In an illustrative embodiment, the adhesive material 18A-18D is EFEP. However, it is understood that this is only illustrative and any suitable adhesive can be utilized.

Figure 3C:
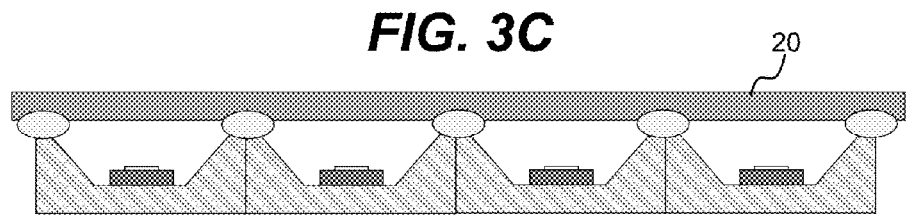
Figure 3D:
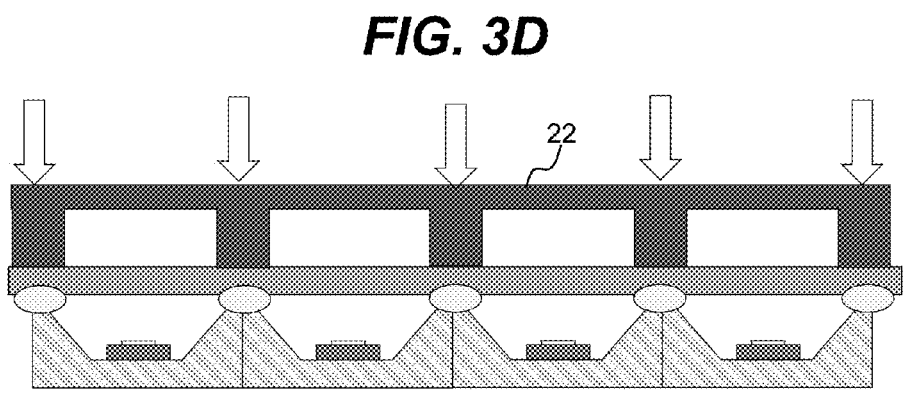

In FIG. 3C, a transparent polymer film 20 is placed over the top surface of the structure 10. In an embodiment, the transparent polymer film 20 completely covers all components of a device package 12A-12D that can benefit from protection from the environment (e.g., the optoelectronic device 14A-14D, the walls of the corresponding depression, and/or the like). In a more specific embodiment, the transparent polymer film 20 covers multiple adjacent device packages 12A-12D. In a still more specific embodiment, the transparent polymer film 20 covers all device packages 12A-12D in the structure 10. Regardless, the transparent polymer film 20 can adhere to the adhesive material 18A-18D. It is understood that the transparent polymer film 20 can be formed of any type of ultraviolet transparent material described herein. In an embodiment, a particular material for the transparent polymer film 20 is selected based on its transmittance for a peak wavelength of radiation for the corresponding optoelectronic device 14A-14D. In FIG. 3D, a stamp tool 22 can be used to apply a force on the transparent polymer film 20 at the locations of the adhesive material 18A-18D in order to secure the transparent polymer film 20 to the structure 10. The stamp tool 22 can be formed of any type of material that does not adhere to the transparent polymer film 20, e.g., steel, glass, and/or the like.

It is understood that the process shown in FIGS. 3A-3D is only illustrative of various processes. To this extent, one or more acts in the process can be modified and/or not performed and/or additional acts can be performed. For example, rather than the adhesive material 18A-18D being applied to a top surface of the structure 10, the adhesive material 18A-18D can be applied to the transparent polymer film 20 in locations corresponding to the top surface of the structure 10 when the transparent polymer film 20 is properly aligned with the structure 10. Furthermore, the process can include cleaning the transparent polymer film 20 prior to placing the film 20 over the top surface of the structure 10, e.g., by applying a cleaning agent or the like.

Furthermore, in addition to or alternative to applying a force on the transparent polymer film 20, the locations of the transparent polymer film 20 corresponding to the adhesive material 18A-18D can be heated to further promote a strong bond between the transparent polymer film 20 and the structure 10. In an embodiment, the transparent polymer film 20 is heated up to and/or beyond the melting temperature of the transparent polymer film 20, e.g., such that the transparent polymer film 20 (or a portion thereof) can become flowable. As used herein, flowable means that the film 20 (or a portion thereof) is softened and able to move due to the force of gravity, application of external pressure, and/or the like. In a more specific embodiment, the material for the transparent polymer film 20 is selected to have a sufficiently low melting temperature such that the required heat will not damage the optoelectronic device(s) 14A-14D. In a still more specific embodiment, the transparent polymer film 20 is formed of EFEP.

The heating can be performed using any solution. For example, the stamp tool 22 can include a laser, which can be configured to direct a laser onto a set of desired locations of the transparent polymer film 20 to induce localized or time depending heating of the desired location(s) of the transparent polymer film 20. Alternatively, the stamp tool 22, or the contact surface(s) thereof, can be heated, which will result in the heat being applied to the transparent polymer film 20 when the stamp tool 22 is contacting the transparent polymer film 20. Still further, the entire assembly 10, 20, 22 can be heated (e.g., within a heating chamber). Additionally, adhesion can be influenced by one or more chemical catalysts present in the environment while the transparent polymer film 20 is being adhered to the structure 10. In addition, adhesion can include curing using light of an appropriate wavelength. To this extent, the adhesive material 18A-18D also can include glue like polymers activated/cured by light.

In an embodiment, the transparent polymer film 20 can be securely attached to the structure 10 without the use of an adhesive material 18A-18D. To this extent, FIG. 4A shows a transparent polymer film 20 being applied to the structure 10 and FIG. 4B shows a three-dimensional view of the resulting assembly 24 according to an embodiment. As illustrated, the transparent polymer film 20 directly contacts the top surface of the device packages 12A-12D. The film 20 can be adhered to the device packages 12A-12D using pressure, heating (e.g., to induce melting and subsequent curing of the film 20), and/or the like.

Regardless, when the packaging process is complete, some or all of the device packages 12A-12D can be physically separated from one another using any solution. For example, the device packages 12A-12D can be cut using a laser, scribed and broken apart, sawed, and/or the like. In an embodiment, the device packages 12A-12D are separated from one another along the lines 26A-26E to create individual packaged optoelectronic devices capable of utilization in a variety of circuits. Regardless, after separation, the transparent polymer film 20 can be sufficiently adhered to the top surface of the device packages 12A-12D to provide effective protection from the environment for the components of the device package 12A-12D. In an embodiment, some or all of the device packages 12A-12D can remain physically connected, e.g., to create a structure including multiple packaged optoelectronic devices 14A-14D (FIG. 3A). Alternatively, all of the device packages 12A-12D can be physically separated from one another to create multiple individually useable packaged optoelectronic devices 14A-14D.

Figure 5A:
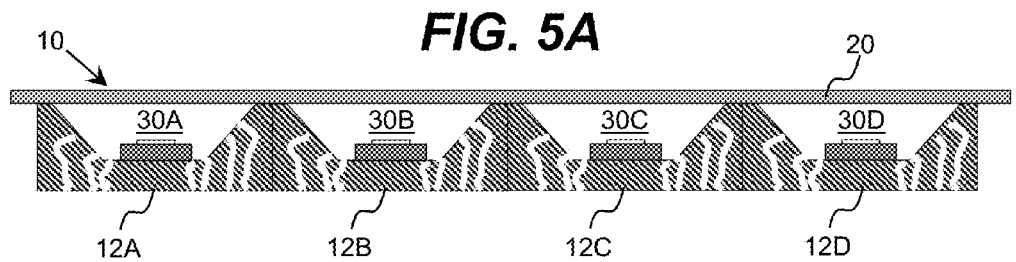
FIGS. 5A-5D illustrate a packaging processes in which the transparent polymer film is molded to a shape of the top surface of the device packages according to embodiments.
Figure 5B:
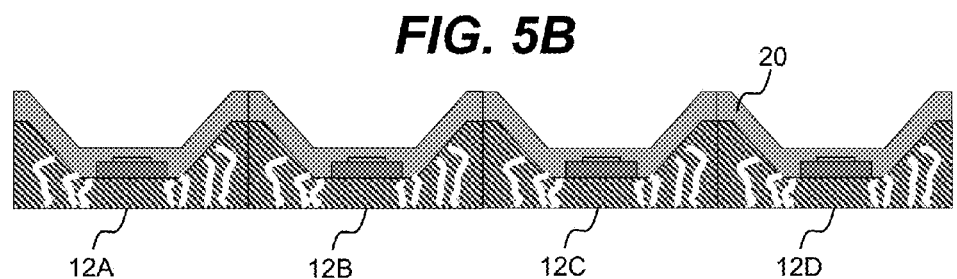

It is understood that the packaging process can include various modifications and/or additions. For example, FIGS. 5A-5D illustrate packaging processes in which the transparent polymer film is molded to a shape of the top surface of the device packages 12A-12D according to embodiments. In this case, as shown in FIG. 5A, a transparent polymer film 20 can be placed on the top surface of the device packages 12A-12D as described herein. Subsequently, a vacuum can be utilized to reduce the pressure within each cavity 30A-30D formed by the polymer film 20 and depressions of the device packages 12A-12D. In response, the transparent polymer film 20 will collapse into the cavity 30A-30D, eventually coating the top surface of the device packages 12A-12D (e.g., similar to a shrink wrap) as shown in FIG. 5B. The pressure can be sufficient to cause the transparent polymer film 20 to adhere to the top surface of the device packages 12A-12D.

Figure 5C:
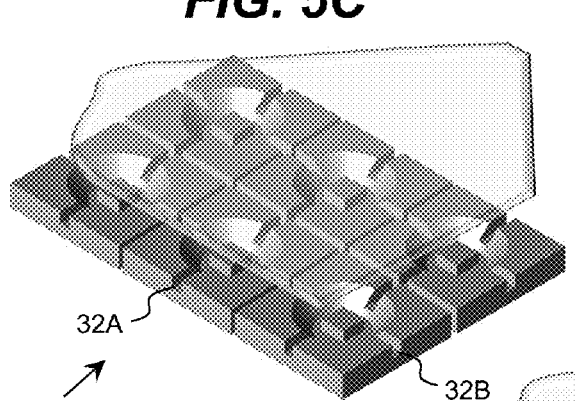
Figure 5D:
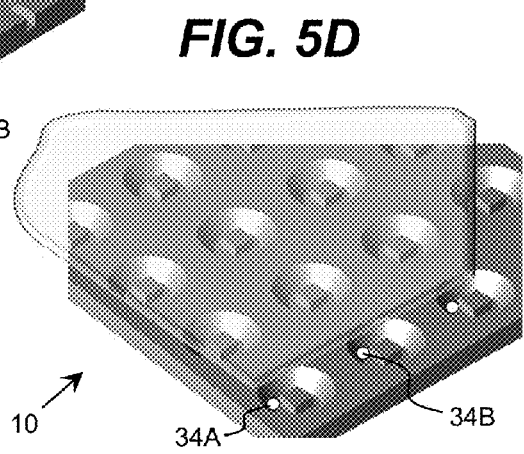

In an embodiment, the entire structure 10 is placed within a vacuum chamber to produce the desired reduction in pressure within each cavity 30A-30D. Furthermore, the structure 10 can include one or more features to further reduce the pressure within the cavities 30A-30D. For example, FIG. 5C shows a structure 10 including channels 32A, 32B extending partially through the device packages 12A-12D and intersecting with the cavities 30A-30D. Similarly, FIG. 5D shows a structure 10 including through holes 34A, 34B located on the bottom surfaces of the cavities 30A-30D and extending through the device packages 12A-12D. FIGS. 5A and 5B show an alternative configuration in which multiple through holes 34A, 34B are located in each device package 12A-12D. In each case, the channels 32A, 32B and/or through holes 34A, 34B can facilitate the flow of air out of the cavities 30A-30D, thereby enabling air to be expunged from the cavities 30A-30D while they are covered by the transparent polymer film 20.

Regardless, it is understood that the process shown in FIGS. 5A-5D can utilize heat to further induce adhesion between the transparent polymer film 20 and the device packages 12A-12D as described herein. To this extent, the entire structure 10 can be heated, e.g., to an approximate melting point of the transparent polymer film 20, prior to, during, and/or after the pressure is reduced within the cavities 30A-30D.

Figure 6A:
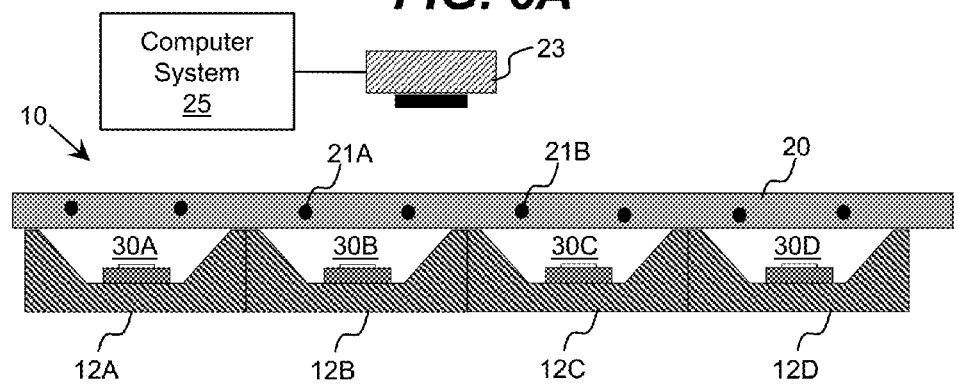
FIGS. 6A and 6B show another embodiment of packaging a set of device packages according to an embodiment.
Figure 6B:
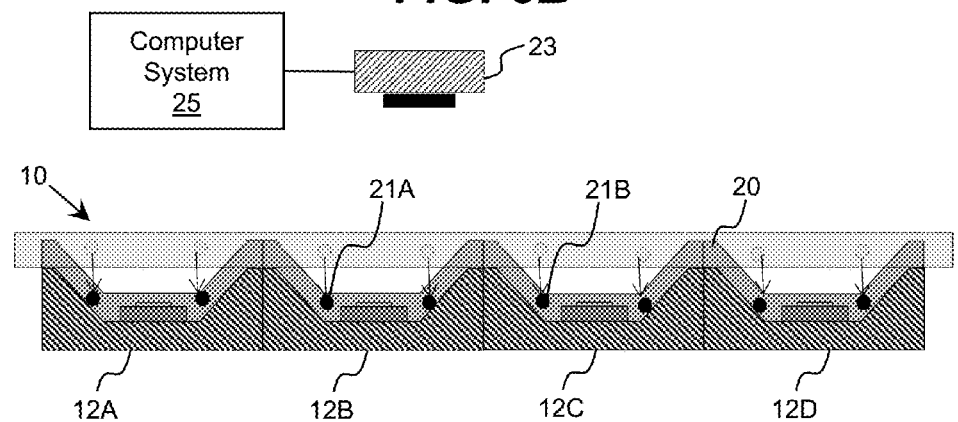

It is understood that use of vacuum pressure is only illustrative of various approaches that can be utilized to mold the transparent polymer film 20 to a surface of the device packages 12A-12D. To this extent, FIGS. 6A and 6B show another embodiment of packaging a set of device packages 12A-12D according to an embodiment. In this case, the transparent polymer film 20 includes a plurality of markers 21A, 21B. Each marker 21A, 21B can be formed using any solution. For example, a marker 21A, 21B can comprise a visibly distinct particle included in the transparent polymer film 20. For example, the markers 21A, 21B can be a metallic or ceramic material, such as aluminum, alumina, or the like. However, it is understood that each marker 21A, 21B can be formed of any visibly observable material, which will not adversely impact fabrication and/or operation of the structure in a significant manner. As shown in FIG. 6A, a camera 23 can record a position of the markers 21A, 21B when the film 20 is initially applied onto the set of device packages 12A-12D. Subsequently, the structure 10 can be heated to a point at which the film 20 is softened and begins to flow, e.g., due to gravity or another pressure being applied. As a result of the flow, the markers 21A, 21B begin to move (as illustrated by the arrows in FIG. 6B), and the camera 23 can record the movement.

A computer system 25 (e.g., programmed computing device) can analyze the motion of the markers 21A, 21B using the image data acquired by the camera 23. Furthermore, the computer system 25 can estimate one or more properties of the film 20 based on the rate of the motion of the markers 21A, 21B. For example, the computer system 25 can determine that the film 20 has encapsulated the devices once motion of the markers 21A, 21B has stopped after a period of rapid motion as shown in FIG. 6B. At this point, the computer system 25 can apply a pressure to induce adhesion between the film 20 and the device packages 12A-12D.

The computer system 25 can analyze the motion of the set of markers 21A, 21B and can adjust one or more parameters (e.g., heating, pressure/vacuum, and/or the like) of the system based on the rate of marker motion. For example, when the computer system 25 determines that no significant marker motion has occurred after an initial period of time (e.g., twenty minutes), the computer system 25 can increase a temperature in the chamber to induce further melting of the film 20. It is understood that the camera 23 can be positioned at any angle, which provides favorable image data for detecting the motion of the markers 21A, 21B. Additionally, the computer system 25 can evaluate one or more optical properties (in visible and/or ultraviolet spectra) of the film 20 to determine when to commence applying pressure, increase temperature, and/or the like. It is understood that the examples above are only illustrative and other embodiments of a process in which the computer system 25 alters one or more parameters (e.g., the temperature, pressure, and/or the like) in response to the optical parameters of the polymer film 20, the position of markers 21A, 21B, and/or the rate of their motion are possible.

In a specific illustrative embodiment, a film 20 of EFEP is used to encapsulate a set of ultraviolet optoelectronic device mounted within a set of device package 12A-12D. EFEP can be utilized due to several beneficial properties: a melting temperature sufficiently low to avoid damaging the device; highly adhesive to the device, submount, and mounting board; and/or the like.

In a specific illustrative procedure corresponding to the EFEP film 20, the film 20 has a thickness in a range of 100-250 microns. After being placed on the device package(s) 12A-12D, the film 20 is heated to a temperature in a range of 180-240° C. for at least one hour at pressures between 20 and 60 Torr. In a more specific procedure, the heating is conducted for approximately two hours. In an alternative embodiment, the computer system 25 can monitor the film 20 and terminate the heating once the film 20 becomes flowable (e.g., motion of the surface of the film is visible, or at least involves a few millimeters of displacement). The EFEP film 20 can experience a distinct phase transition when heated to a temperature approximate to its melting temperature. The phase change is accompanied with a change of transparent properties of the material 20, where a previously opaque material becomes transparent to visible and UV radiation. An embodiment of the process includes heating the EFEP film 20 at least to temperatures where the phase change occurs. A further embodiment includes maintaining a temperature until the material is at least twenty percent more transparent to visible and/or ultraviolet radiation (more specifically ultraviolet radiation between 240-360 nanometers) than prior to the phase change.

An embodiment of a process uses time dependent heating of the film 20. For example, the computer system 25 can operate a heating element (e.g., in a heating chamber) to heat the film 20 to a first temperature, T1, to induce a phase transition for a duration of time, t1. Subsequently, the computer system 25 can increase the temperature to a second temperature, T2, in order to improve the adhesion of the film 20 to the optoelectronic device(s) and/or device package(s) for a duration of time, t2. For clarity, the first heating stage can be referred as a phase changing stage, and the second stage can be referred to as an adhesive stage.

At the start of the process, the computer system 25 can monotonically increase the temperature, for example, at a rate slower than one degree Celsius per second, and more preferably at one degree Celsius per few minutes. Once attained, the temperature can be maintained at the temperature T1 for a duration of time t1. Subsequently, the computer system 25 can again monotonically increase the temperature to the temperature T2 at a preferable rate of about one degree per few minutes, and maintain the temperature at the temperature T2 for a duration of time t2, before commencing a cool down phase. The temperature T1 can be in a range of 180-210 C and the temperature T2 can be in a range of 200-240 C. Both of the times t1 and t2 can be in a range of 5-60 min, with t2 being preferably in the range of 5-30 min.

In an embodiment, the heating and cooling cycle can comprise several periods. In addition, during the adhesive stage, a vacuum can be applied. In one embodiment, the computer system 25 applies the vacuum at about one third of the time through the time t2. In more specific embodiment, the computer system 25 further applies pressure at about two thirds of the time through the time t2, which can provide for better adhesion. The vacuum and pressure cycles can comprise several periods throughout the adhesive phase.

It is understood that the heating process can be altered depending on the properties of the UV transparent film 20 being utilized. For example, a Daikin RP-4020 EFEP polymer film can be heated in the range of 180-210 C, while a Daikin RP-5000 EFEP polymer film can be heated in the range of 220-240 C. It is further understood that a process can include applying several films 20 one over the other. In this case, the procedure can include encapsulating with the first film using a first heating process and encapsulating with the second film using a second heating process, where each heating process involves selection of optimal heating temperatures, pressures, and times needed for applying heating and pressure for the corresponding film. When multiple films are utilized, an illustrative embodiment uses EFEP material as the first film applies directly adjacent to the top surface of the device package 12.

Figure 7A:
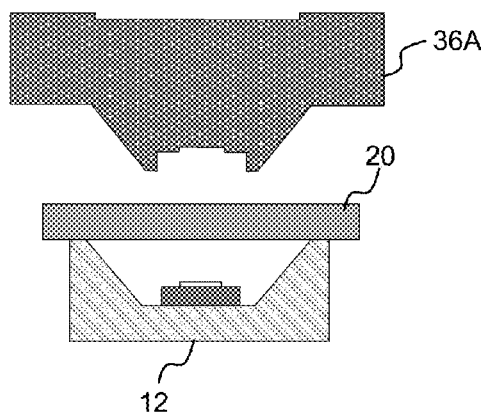
FIGS. 7A-7C illustrate use of a stamp tool in packaging a device package according to embodiments.
Figure 7B:
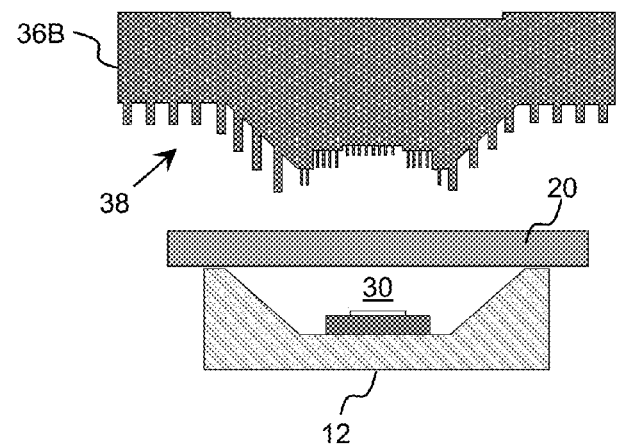
Figure 7C:
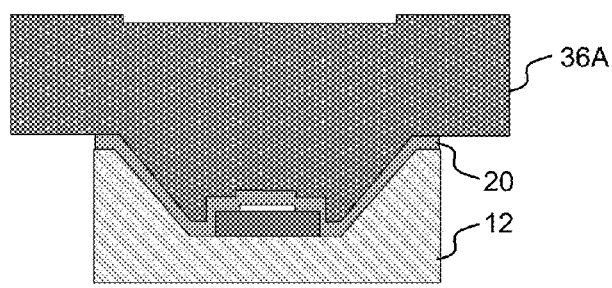

FIGS. 7A-7C illustrate use of a stamp tool 36A, 36B in packaging a device package 12 according to embodiments. As shown in FIG. 7A, a surface of the stamp tool 36A can form an inverse shape as that of the top surface of the device package 12. The stamp tool 36A can be formed using any solution, such as mold casting, or the like. Regardless, as shown in FIG. 7C, after placing the transparent polymer film 20 over the top surface of the device package 12, the stamp tool 36A can be lowered to force the transparent polymer film 20 down onto the surfaces of the device package 12.

As shown in FIG. 7B, a stamp tool 36B can include protrusions 38 extending from the surface, which can be configured to deliver point adhesion of the transparent polymer film 20 and/or provide gaps to allow air to escape from within the cavity 30. It is understood that an adhesive, heat, pressure, and/or the like, can be utilized in addition to a stamp tool 36A, 36B as described herein to facilitate adhesion between the transparent polymer film 20 and the device package 12. Additionally, it is understood that while a single device package 12 is shown for clarity, a stamp tool 36A, 36B can have a surface configured to concurrently mold multiple device packages 12, e.g., located in an array.

Figure 8A:
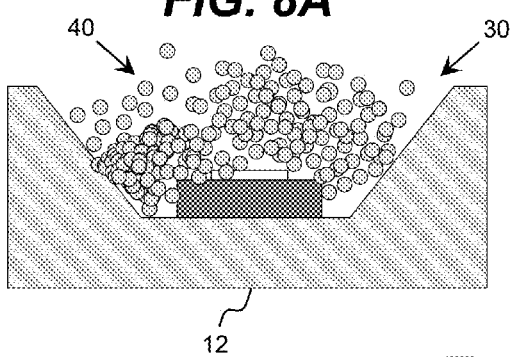
FIGS. 8A-8D illustrate use of a powder to encapsulate components of an optoelectronic device package according to embodiments.
Figure 8B:
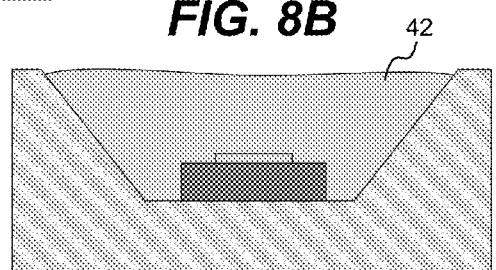

It is understood that use of a transparent polymer film 20 is only illustrative of approaches for protectively covering components of an optoelectronic device package 12. To this extent, FIGS. 8A-8D illustrate use of a transparent polymer powder to encapsulate components of an optoelectronic device package according to embodiments. For example, as shown in FIGS. 8A, 8B, a powder 40 comprising particles (e.g., pellets) of a transparent polymer can be deposited within a cavity 30 of a device package 12 in which the optoelectronic device is mounted. Subsequently, the powder 40 can be subjected to heating to cause the powder 40 to melt and subsequently cure to form a protective transparent coating 42 as shown in FIG. 8B. Prior to and/or concurrent with the heating, the powder 40 can be packed to a target density using any solution (e.g., a stamp tool).

Figure 8C:
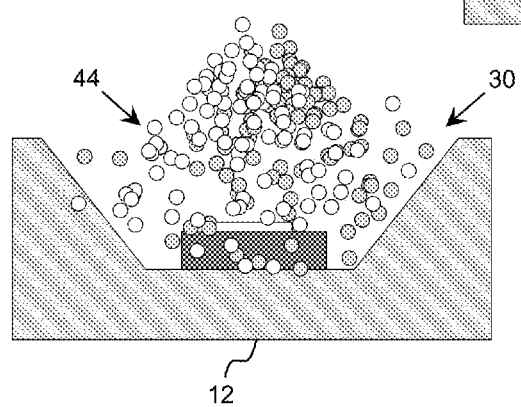
Figure 8D:
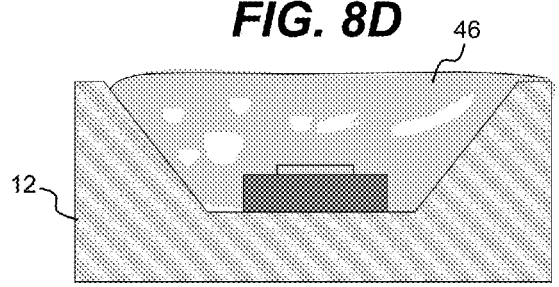

As illustrated by FIGS. 8C, 8D, a powder 44 can include a mixture of two or more materials (indicated by different colors of particles), which is subsequently melted and allowed to cure to form a transparent coating 46. A combination of two or more materials can be selected to provide any of various possible benefits. For example, when the materials have a refractive index mismatch, the transparent coating 46 can produce a diffusive scattering of ultraviolet radiation emitted by the optoelectronic device. Additionally, particles of other ultraviolet transparent materials and/or ultraviolet transparent materials in liquid form can be placed within the cavity 30 and incorporated into the transparent coating 46. For example, illustrative materials include: fused silica powders; fused silica spheres; domains containing sapphire, AlN, air, water and/or any other stable UV transparent media; and/or the like. Furthermore, in addition to ultraviolet transparent materials, ultraviolet reflective media (e.g., a powder, a film, and/or the like), ultraviolet fluorescent materials (e.g., phosphorus), and/or the like, can be placed within the cavity 30 and incorporated into the coating 46. In an embodiment, use of a powder 40, 44 can be combined with use of a transparent polymer film as described herein in order to encapsulate optoelectronic device(s).

A transparent coating 42, 46 can be shaped to provide any type of wave guiding structure using any solution. For example, a surface of the transparent coating 42, 46 can form a lens. In an embodiment, such a surface is formed by using a molding enclosure to shape the powder 40, 44 when melting and allowing the powder 40, 44 to cure. In other embodiments, a wave guiding structure can be applied to a surface of a transparent coating. To this extent, FIGS. 9A-9H show illustrative optoelectronic device packages including wave guiding structures according to embodiments.

Figure 9A:
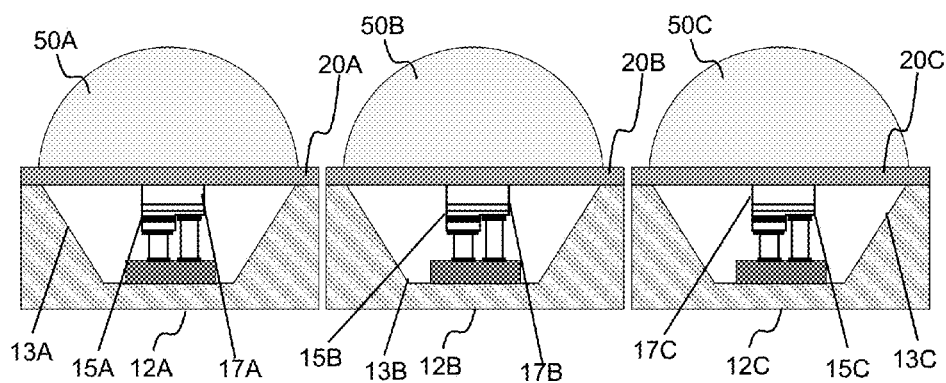
FIGS. 9A-9H show illustrative optoelectronic device packages including wave guiding structures according to embodiments.

In FIG. 9A, each device package 12A-12C includes a respective cavity 13A-13C with a corresponding optoelectronic device 15A-15C and substrate 17A-17C mounted therein. Each device package 12A-12C further includes a transparent polymer film 20A-20C with a lens 50A-50C attached to the optoelectronic devices 15A-15C and the device package 12A-12C. As shown in FIG. 9A, the ultraviolet transparent polymer film 20A-20C with the lens 50A-50C can attach to the optoelectronic devices 15A-15C via the substrates 17A-17C, and to the device packages 12A-12C at a top surface that surrounds the optoelectronic devices. In addition to including any of the aforementioned ultraviolet transparent materials, the ultraviolet transparent polymer film 20A-20C can include ultraviolet transparent polymer materials such as, for example, silicon and oxygen molecules. The lenses 50A-50C can be formed of any type of ultraviolet transparent material, such as sapphire, fused silica, a transparent polymer, and/or the like. Furthermore, the lenses 50A-50C can be fabricated using any solution (e.g., melting a powder or other particles in a molding enclosure). Regardless, each lens 50A-50C can be attached to the transparent polymer film 20A-20C using any solution, either before or after the device packages 12A-12C have been separated from one another.

Figure 9B:
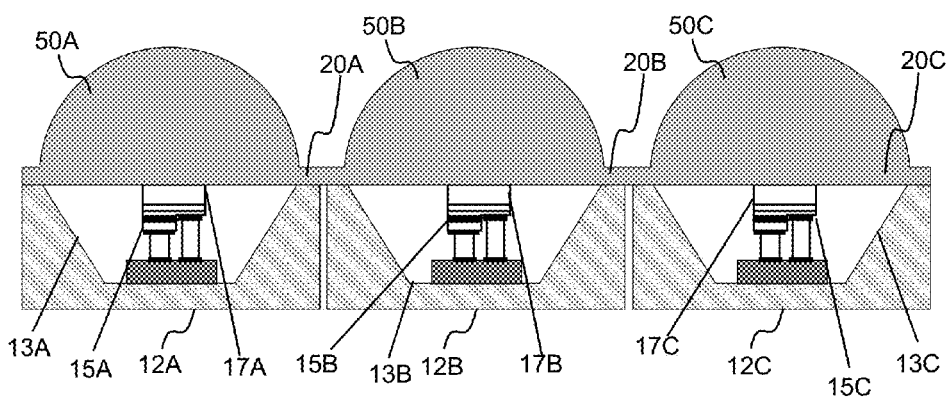

In FIG. 9B, all of the lenses 50A-50C formed over the optoelectronic devices 15A-15C, respectively, are interconnected, as opposed to the embodiment depicted in FIG. 9A in which each of the optoelectronic devices has a separate lens formed there over. In this manner, the lenses 50A-50c can form one lens packaging layer. In addition, in the embodiment of FIG. 9B, the lenses 50A-50C can be formed from the same ultraviolet transparent polymer material used for the transparent polymer film 20A-20C. In one embodiment, the interconnected lenses 50A-50C can be formed from the same ultraviolet transparent polymer material used for the transparent polymer film 20A-20C by patterning the transparent polymer film 20A-20C. The patterning can be performed, for example, through mold imprinting on the transparent polymer film.

Figure 9C:
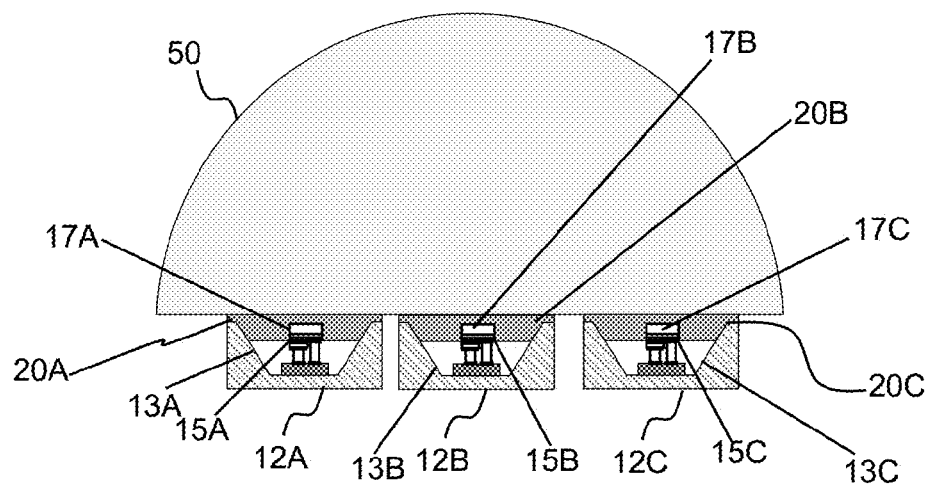

FIG. 9C shows yet another embodiment in which a large lens is used as a wave guiding structure with the set of optoelectronic devices 15A-15C and the device packages 12A-12C. In this embodiment, a single lens 50 is formed over multiple optoelectronic devices 15A-15C and device packages 12A-12C. As shown in FIG. 9C, the lens 50 can extend over each of the optoelectronic devices in the set of optoelectronic devices 15A-15C and the corresponding device packages. The lens 50 can also extend beyond a periphery of the optoelectronic devices and the device packages on the outer edges of the set as depicted in FIG. 9C in order to improve light extraction efficiency by utilizing a lens that is larger than the area covered by the device packages 12A-12C. In one embodiment, the lens 50 can include, but is not limited to, $SiO_2$, sapphire, $CaF_2$, $MgF_2$ and/or other partially transparent materials. In one embodiment, the lens 50 can also include domains containing ultraviolet transparent fluids such as, for example, water, in order to provide enhance transmission of light or ultraviolet radiation generated from the optoelectronic devices 15A-15C. These domains of ultraviolet transparent fluid domains can be completely encapsulated by an ultraviolet transparent media which can comprise a fluoropolymer material such as any of those noted above.

The lenses depicted in FIGS. 9A-9C can be coupled to the optoelectronic devices 15A-15C and the device packages 12A-12C in a variety of ways. All of these approaches are characterized by having the ultraviolet transparent polymer film 20A-20C solidly attach to a surface of the substrate 13A-13C. This enables increased light extraction from the optoelectronic devices 15A-15C or increased light absorption by the devices. For example, direct bonding is beneficial for light extraction from ultraviolet LEDs. In one embodiment, an adhesive material, such as, but not limited to, EFEP, ETFE, polytetrafluoroethylene (Teflon), and/or the like, can be applied to the lenses 50A-50C, the ultraviolet transparent polymer film 20A-20C, or both, in order to facilitate an adherence between both elements. In another embodiment, a binding media can be applied to the lenses 50A-50C, the ultraviolet transparent polymer film 20A-20C, or both. Examples of binding media include, but are not limited to, a fusible metallic alloy (e.g., a eutectic, fusible alloy or other suitable soldering metal), a flowable oxide, a liquid deposited (spray, coated, etc.) adhesive, and a curing adhesive. In one embodiment, where the substrate 13A-13C comprises sapphire, a surface-activated bonding or an atomic diffusion bonding material as known in art can be used to attain a coupling of the optoelectronic devices 15A-15C, the ultraviolet transparent polymer film 20A-20C and the lenses 50A-50C. In still another embodiment, physical forms of attachment, such as mechanical means involving screws and similar mechanical means of providing binding forces can be used for coupling these elements.

Figure 9D:
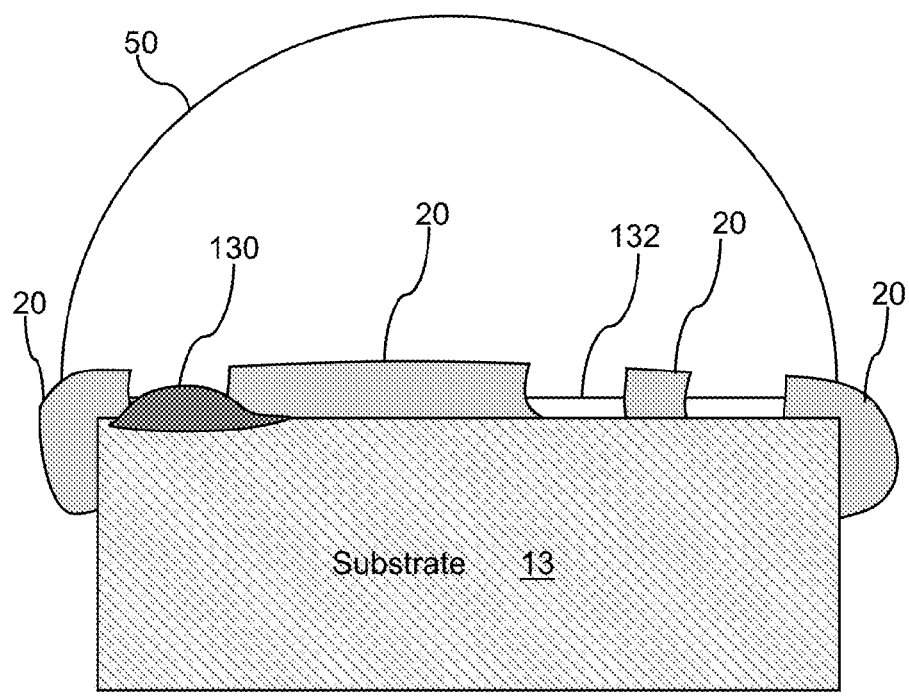

FIG. 9D shows a more detailed view of the coupling of a substrate 13 of an optoelectronic device (not represented) with the ultraviolet transparent polymer film 20 and the lens 50. In this embodiment, the lens 50 can be directly bonded to the ultraviolet transparent polymer film 20. As shown in FIG. 9D, the ultraviolet transparent polymer film can comprise a plurality of discontinuous portions of the polymer material that can attach lens 50 to the substrate 13 at several locations. As shown in FIG. 9D, the discontinuous portions of the ultraviolet polymer material can extend along sections of a top surface of the substrate and/or sections of its sides.

It is understood that the spacing, location, and formation of each of these discontinuous portions of the ultraviolet transparent polymer material 20 on the substrate 13 is variable, and thus, the representation of FIG. 9D is not meant to limit the various embodiments described herein.

A binding media 130 can be applied in between at least one of the discontinuous portions of the ultraviolet transparent polymer material 20. The binding media 130 can be selected from the group consisting of a fusable metallic alloy, a surface activated bonding material, an atomic diffusion bonding material, a flowable oxide and a liquid deposited adhesive. In an embodiment, use of the ultraviolet transparent polymer film 20 can be replaced with the binding material 130, which can be deposited and cured.

Other types of materials can be placed between any of the discontinuous portions of the ultraviolet transparent polymer material 20 in addition to or instead of the binding media. Such materials can include a reflective material (e.g., aluminum, PTFE, a highly ultraviolet reflective expanded polytetrafluoroethylene (ePTFE) membrane (e.g., GORE® Diffuse Reflector Material), and/or the like), an ultraviolet diffusively transparent material (e.g., polytetrafluoroethylene (Teflon)), etc. As shown, vacancies 132 can be left between the lens 50 and the substrate 13, unoccupied by any substance besides the ambient environment such as air.

Figure 9E:
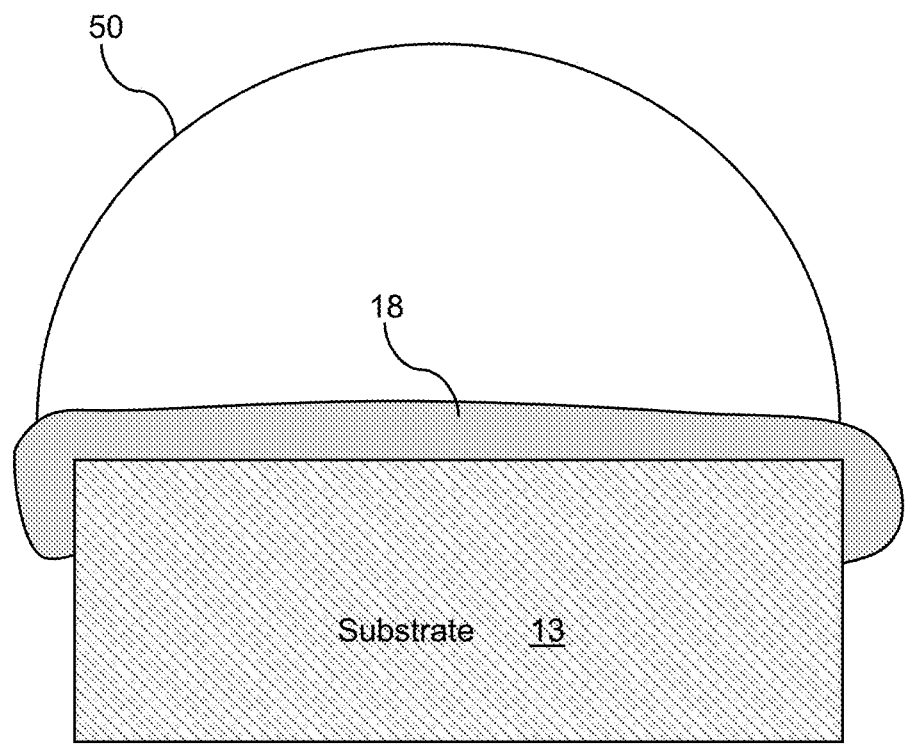

FIG. 9E shows another embodiment in which the lens 50 can be directly bonded to the substrate 13 using an adhesive material 18, such as a flowable oxide, which can be deposited (e.g., sprayed, coated, etc.) and cured. In this embodiment, the adhesive material 18 can extend continuously over entire top surface of the substrate 13 and wrap around to cover a portion of each of its side surfaces. As shown in FIG. 9E, the adhesive material 18 can extend out beyond a periphery of the outer edges of the lens 50. A benefit to having the adhesive material 18 extend out beyond a periphery of the outer edges of the lens 50 to wrap around and cover a portion of each of its side surfaces includes improved extraction of the light from the sides of the substrate 13.

Figure 9F:
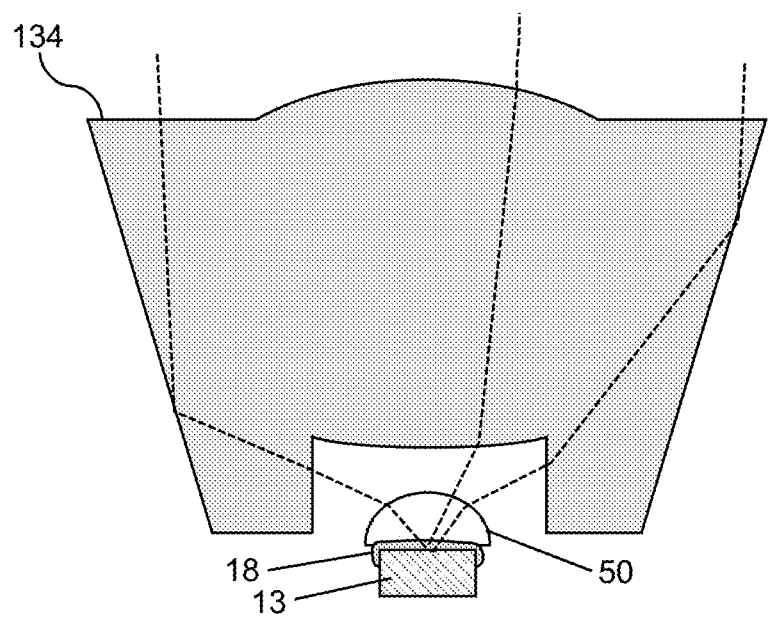

The configuration of the optoelectronic devices and the lenses depicted in FIGS. 9A-9E can be enhanced according to their intended application. For example, if it is desirable to collect the light generated from the devices, magnify its intensity, direct it to a target surface, and then blur it to enhance beam and color uniformity, then a secondary wave guiding structure can be paired to the optoelectronic devices and the lenses. In one embodiment, as shown in FIG. 9F, a total internal reflection (TIR) lens 134 can be positioned over the lens 50, the adhesive material 18, and the substrate 13 from which the optoelectronic device and device package are attached. In this manner, the TIR lens 134 and its positioning with regard to the lens 50, the adhesive material 18, and the optoelectronic device and device package can facilitate an effective focus of the emitted radiation.

Figure 9G:
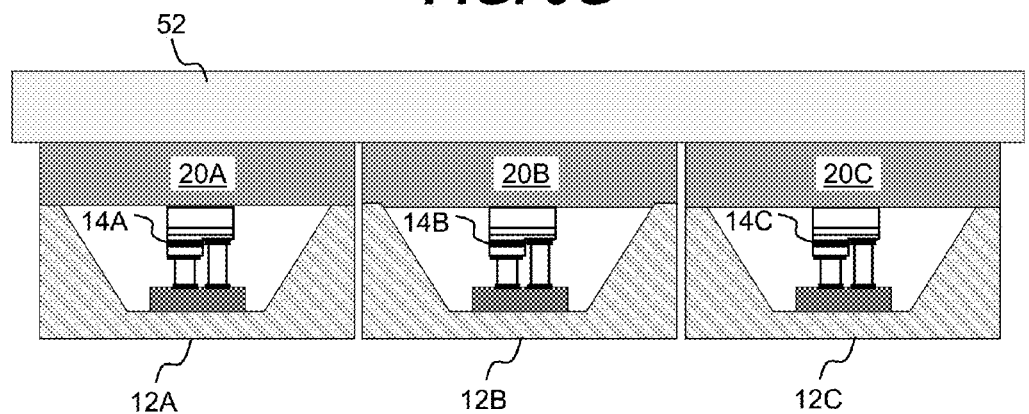

A lens is only illustrative of various types of optoelectronic components, such as wave guiding components, that can be attached to the device packages 12A-12C. For example, FIG. 9G shows an optical fiber 52 coupled to a set of device packages 12A-12C according to an embodiment. In this case, each device package 12A-12C includes a corresponding transparent polymer film 20A-20C to which the optical fiber 52 is attached using any solution. In a more particular embodiment, each device 14A-14C can be configured to emit ultraviolet radiation at a different peak wavelength. In this case, ultraviolet radiation of multiple peak wavelengths can be coupled using the optical fiber 52. In another embodiment, a wave guiding structure can couple multiple devices 14A-14C to facilitate their cooperative operation. For example, an ultraviolet LED can be coupled with a laser diode, and the ultraviolet LED can be configured to provide optical pumping for the laser diode.

The lenses 50A-50C and optical fiber 52 can be attached to the transparent polymer film 20A-20C using any solution. For example, the lenses 50A-50C or optical fiber 52 can be placed adjacent to the transparent polymer film 20A-20C while at least a portion of the transparent polymer film 20A-20C is heated to become flowable. As a result, the lenses 50A-50C or optical fiber 52 can partially submerge into the transparent polymer film 20A-20C, and upon cooling of the transparent polymer film 20A-20C, the lenses 50A-50C or optical fiber 52 will be physically attached. In a more specific embodiment, in order to improve adhesion to the transparent polymer film 20A-20C, at least a surface of the transparent polymer film 20A-20C adjacent to the lenses 50A-50C or optical fiber 52 can contain an adhesive polymer (e.g., EFEP), which can further promote adhesion of the lenses 50A-50C. Other solutions can utilize, for example, an ultraviolet transparent epoxy, glue, and/or the like, to adhere the transparent polymer film 20A-20C to the lenses 50A-50C or optical fiber 52.

Figure 9H:
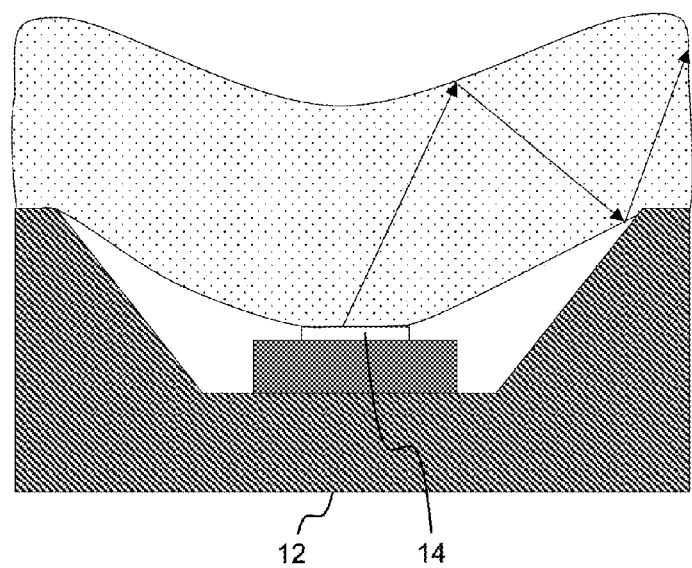

In an embodiment, the transparent polymer film can be configured to provide wave guiding to the light emitted from the device. For example, FIG. 9H shows a device package 12 with a transparent polymer film 20 capable of providing wave guiding for the light emitted by the device 14 (e.g., as shown by arrows). In this case, the transparent polymer film 20 can have a larger thickness (e.g., 100 microns to several millimeters). A thickness of the film 20 can be varied to allow for optimal directional distribution of the intensity of the radiated light using any solution.

It is understood that wave guiding structures are only illustrative of various structures/devices that can be efficiently coupled using a transparent polymer, such as a transparent polymer film 20A-20C, described herein. For example, as shown and described in U.S. Provisional Application No. 61/949,650, entitled "Ultraviolet Surface Illumination and the System Containing the Same," which was filed on 7 Mar. 2014; and U.S. patent application Ser. No. 14/640,051, entitled "Ultraviolet Surface Illuminator," which was filed on 6 Mar. 2015, both of which are incorporated herein by reference, a structure, such as a surface of an electronic gadget, can be coupled to a set of device packages 12A-12C via the transparent polymer film 20A-20C. For example, the transparent polymer film 20A-20C described herein can comprise a screen for the corresponding electronic gadget.

Figure 10A:
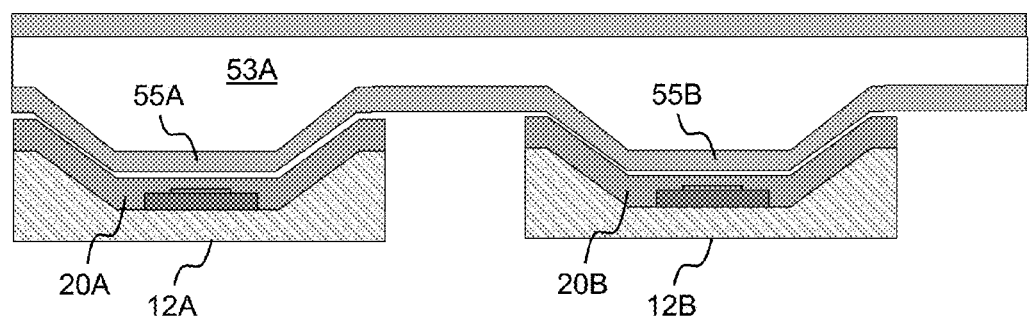
FIGS. 10A-10C show external structures coupled to device packages according to embodiments.
Figure 10B:
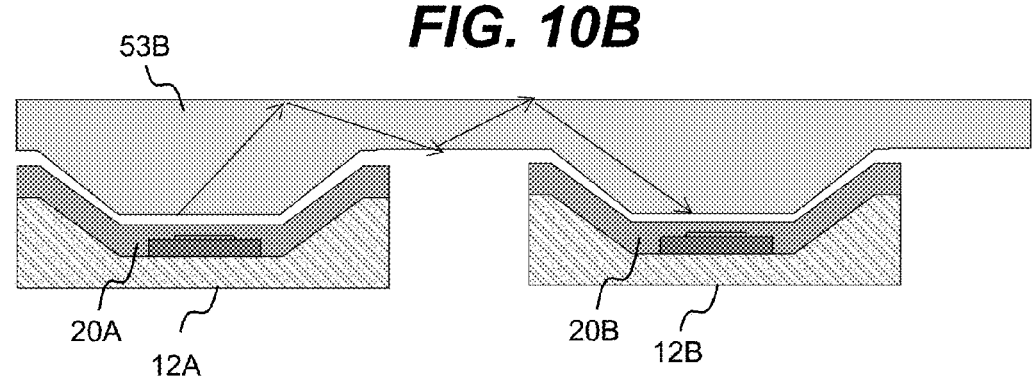
Figure 10C:
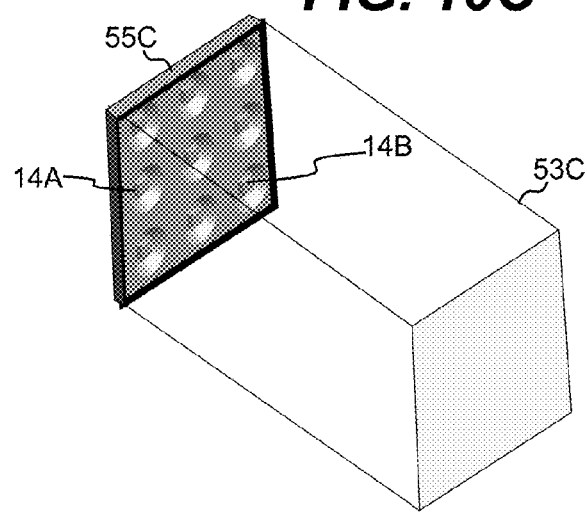

To this extent, FIGS. 10A-10C show external structures 53A-53C coupled to device packages 12A, 12B according to embodiments. In FIG. 10A, the structure 53A can comprise, for example, an enclosure, such as a pipe or the like. In this case, the device packages 12A, 12B can be coupled such that ultraviolet radiation is directed into the enclosure, e.g., for disinfection. At least portions 55A, 55B of the walls of the structure 53A can be formed of an ultraviolet transparent material (e.g., a polymer described herein). Alternatively, as shown in FIG. 10B, the structure 53B can comprise an ultraviolet transparent wave guiding structure. In this case, the structure 53B can be utilized to couple several optoelectronic devices, such as multiple ultraviolet LEDs, a combination of ultraviolet LED(s) and ultraviolet detector(s), and/or the like. In FIG. 10C, an array of device packages including optoelectronic devices 14A, 14B forms a wall 55C of an enclosure structure 53C. In this case, the transparent polymer film covering the optoelectronic devices 14A, 14B can keep the optoelectronic devices 14A, 14B separated from the interior volume of the structure 53C and any media (e.g., flowable media) present therein. The optoelectronic devices 14A, 14B can be operated to disinfect the media within the structure 53C.

The structure 53A, 53B can be coupled to the device packages 12A, 12B using a solution similar to that utilized when the film 20A, 20B is applied to the device packages 12A, 12B. For example, the structure 53A, 53B can be placed in a desired location with respect to the film 20A, 20B for a device package 12A, 12B and heat and/or pressure can be applied to fuse the structure 53A, 53B into the film 20A, 20B. To promote a better attachment, the pressure can be applied on the portions 55A, 55B, where the device is adjacent to the structure 53A, 53B. It is understood that such an attachment process can be performed concurrently with attaching the film 20A, 20B to the device package 12A, 12B or before or after such attachment. Additionally, it is understood that while both structures 53A, 53B are shown having shapes configured to match the cavity of the device package 12A, 12B, this is only illustrative, and the structures 53A, 53B can have substantially straight sides, which can be attached to the film 20A, 20B. For the structure 53C, the device packages can first be attached to a transparent wall in a similar manner. Alternatively, the device packages 12A, 12B can be attached to the wall 55C via the side or bottom surfaces of the device packages 12A, 12B. In an embodiment, an array of device packages 12A, 12B are not separated from one another after production and are utilized as the wall 55C.

Figure 11A:
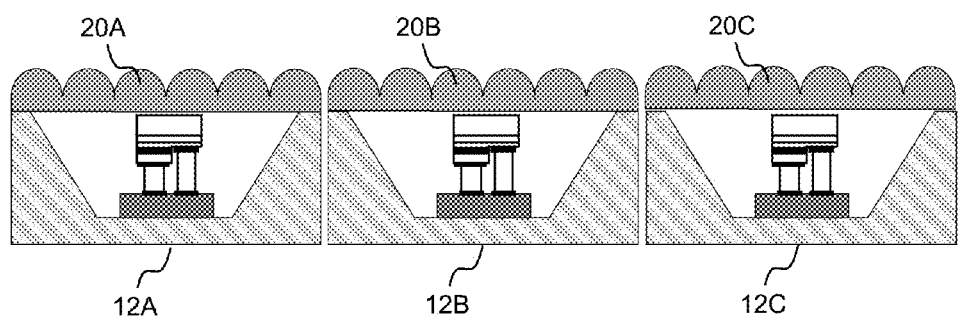
FIGS. 11A-11E show illustrative patterned transparent polymer films according to embodiments.
Figure 11B:
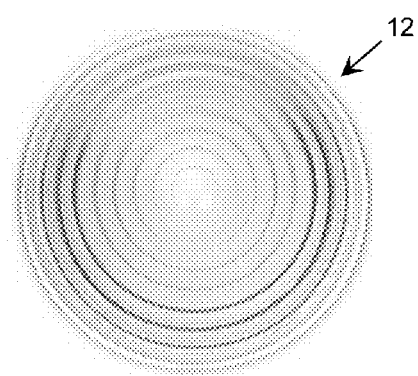
Figure 11C:
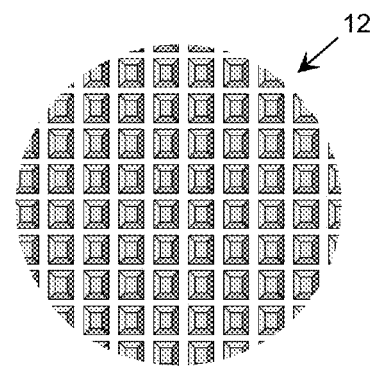
Figure 11D:
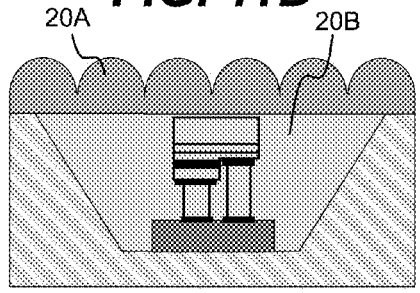
Figure 11E:
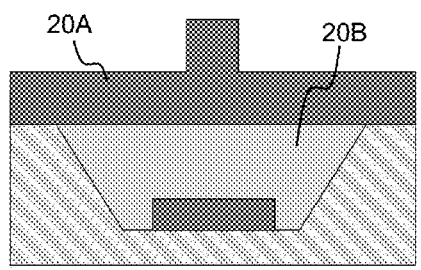

The transparent polymer encapsulating material described herein can have an outer surface having any of various shapes and/or patterns. For example, FIGS. 11A-11E show illustrative patterned transparent polymer films according to embodiments. In FIG. 11A, device packages 12A-12C are shown including transparent polymer films 20A-20C having outer surfaces with spherical bumps. In an embodiment, the device packages 12A-12C can be separated from one another at a valley between two adjacent bumps on the outer surface of the transparent polymer films 20A-20C. Furthermore, as shown in FIG. 11B, a device package can be circular, in which case the bumps on a transparent polymer film 20 can form a Fresnel lens pattern. In FIG. 11C, a transparent polymer film 20 is shown including an array of pyramid-like shapes (e.g., truncated pyramids), which can be arranged in an array. It is understood that various other patterns can be utilized, including patterns having features of multiple distinct scales. For example, a pattern can have a first set of features of a first scale that is larger than the wavelength of the electromagnetic radiation emitted by the optoelectronic device, and a second set of features of a second scale that is smaller or on the order of magnitude as the wavelength of the electromagnetic radiation. Still further, it is understood that an encapsulant formed from particles can include any similar pattern described herein. Alternatively, as shown in FIGS. 11D and 11E, a patterned film 20A can be applied over a top of an encapsulant 20B, both of which can be formed from the same or different transparent materials. In either case, optical elements, such as waveguides can be directly formed from a fluoropolymer film. It is understood that these patterns are only illustrative of numerous patterns that can be formed. To this extent, embodiments can include any combination of one or more of: Fresnel lenses; conventional lenses; optical waveguides; optical splitters; attenuators; photonic crystals; delay lines; and/or the like, fabricated of a polymer described herein.

Figure 12:
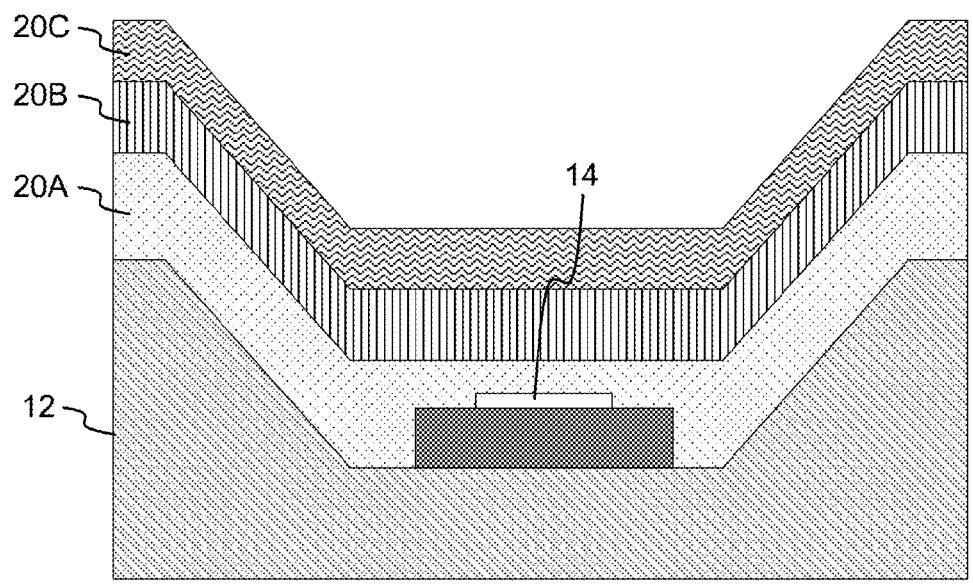
FIG. 12 shows an illustrative device package on which a plurality of transparent polymer films have been applied according to an embodiment.

Embodiments of a device package described herein can include multiple layers of transparent materials. To this extent, any transparent polymer film described herein can be a multi-layer transparent polymer film. For example, FIG. 12 shows an illustrative device package 12 on which a plurality of transparent polymer films 20A-20C have been applied according to an embodiment. In this case, each transparent polymer film 20A-20C can be formed of a unique material, which can be selected based on one or more desired properties for the film 20A-20C. In an illustrative embodiment, a first film 20A can be formed of a material having high adhesive properties to the optoelectronic device 14 and/or device package 12, but which may not have a high ultraviolet transparency. The second film 20B can be formed of a highly ultraviolet transparent material, while the third film 20C can have mechanical and/or chemical properties best suited to withstand the environment and provide a quality sealant for the device 14. In a more specific embodiment, the second film 20B has a transparency at least five percent higher (at least ten percent in a still more specific embodiment) than the transparency of the first film 20A.

In a specific illustrative embodiment, the first film 20A can comprise EFEP; the second film 20B can comprise ETFE, PTFE, or the like; and the outer film 20C can be formed of a material with low adhesive qualities, which can result in environmental agents (such as dust particles) having low or no adhesion to the surface of the encapsulant. The outer film 20C, in addition, can form a protective mechanically stable and hardened layer, being chemically inert. To this extent, the outer film 20C can be biologically inactive and water impenetrable. Illustrative materials for the outer film 20C can include Fluon® ETFE as well as Fluon® LM ETFE, and similar materials.

However, it is understood that the use of three films of these order and attributes is only illustrative of various combinations and features that can be included in a multi-layer structure including any number of two or more layers. To this extent, the functionality of a layer in a multilayered structure can vary. Illustrative features provided by a film/layer include use as: an adhesive to the optoelectronic device 14; a heat spreading layer; a heat conducting layer; an optical index matching layer; an insulating layer; a chip and wirebond protecting layer; a mechanical stabilizer for hot stamping or high temperature overmold process; and/or the like. In an embodiment, the material of each film 20A-20C is selected to increase an extraction efficiency of the optoelectronic device 14, e.g., by selecting materials for each film 20A-20C with optical index of refractions configured to improve extraction efficiency.

Figure 13:
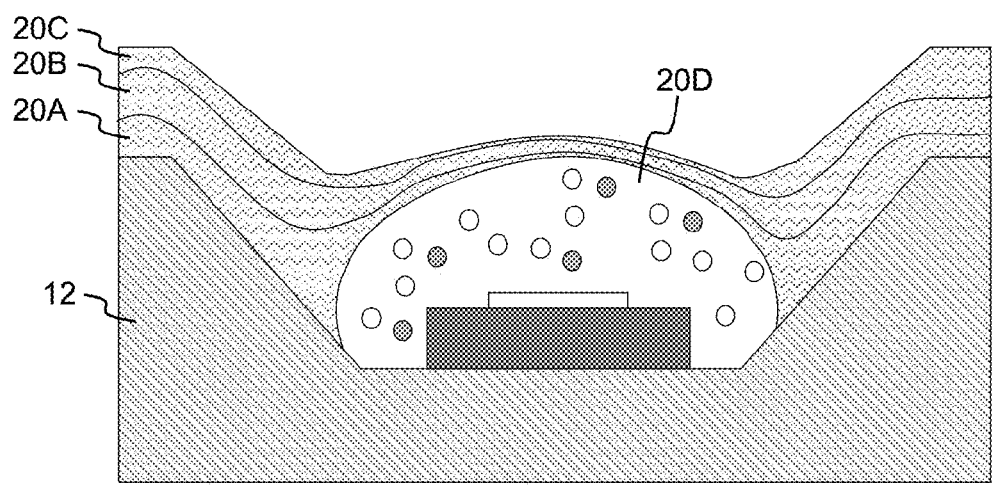
FIG. 13 shows an illustrative device package on which a plurality of films, at least one of which is a composite material, have been applied according to an embodiment.

In an embodiment, one or more of the layers can comprise a composite material as described herein. To this extent, FIG. 13 shows an illustrative device package 12 on which a plurality of films 20A-20D, at least one of which is a composite material, have been applied. For example, the film 20D can be applied as described herein, followed by application of the films 20A-20C, each of which can be formed of a similar or different material as described herein. The film 20D can be a composite material formed of multiple materials. Furthermore, as illustrated, the film 20D can be shaped as a lens, which is subsequently covered by one or more films 20A-20C. The different materials in the film 20D can create volumetric domains (indicated by circular regions) within the film 20D having one or more unique properties from the remainder of the film 20D. As used herein, a domain is a region of material that only partially extends over the device package. For example, the volumetric domains can have a different (e.g., significantly higher or significantly lower) ultraviolet transparency than the remainder of the film 20D. Such domains can be formed of any material including, for example, ultraviolet transparent polymers, fused silica, sapphire, and/or the like. Furthermore, a domain can itself be a composite material, e.g., with micro- and/or nano-particles embedded therein. In an embodiment, a domain (such as particles embedded in the film 20D) is formed of a material that visibly fluoresces under exposure to ultraviolet radiation generated by an optoelectronic device (e.g., a luminophore). In another embodiment, a domain can be diffusively reflective. For example, a diffusively reflective domain can be formed of a highly ultraviolet reflective expanded polytetrafluoroethylene (ePTFE) membrane (e.g., GORE® Diffuse Reflector Material), and/or the like.

Figure 14:
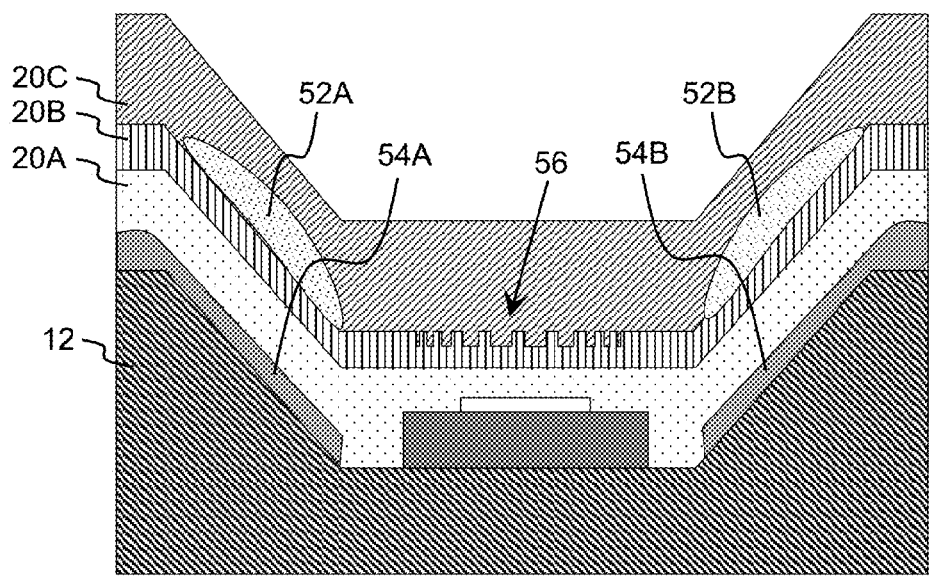
FIG. 14 shows an illustrative device package including several different domains formed thereon according to an embodiment.

In an embodiment, larger scale domains and/or domains formed using alternative approaches are included within the encapsulating materials. For example, FIG. 14 shows an illustrative device package 12 including several different domains formed thereon according to an embodiment. In this case, the domains can include: domains 52A, 52B, which can be formed of a transparent material having diffusive properties; domains 54A, 54B, which can be formed of a material having a spectral or diffusive reflectance; and domain 56, which can be formed by a patterned structure at the interface between the layers 20B, 20C (e.g., which can be formed by patterning or roughening the surface of layer 20B using any solution prior to applying layer 20C). While layer 20B is shown having a patterned structure, it is understood that any combination of one or more layers 20A-20C can include patterning or roughening, which can be configured to provide any desired attribute. To this extent, a layer 20A-20C can include large and small scale roughness, in which the large scale roughness is substantially larger than the target wavelength of the device measured within the film, and the small scale roughness is comparable to (e.g., on the order of) the target wavelength of the device measured within the film.

Figure 15:
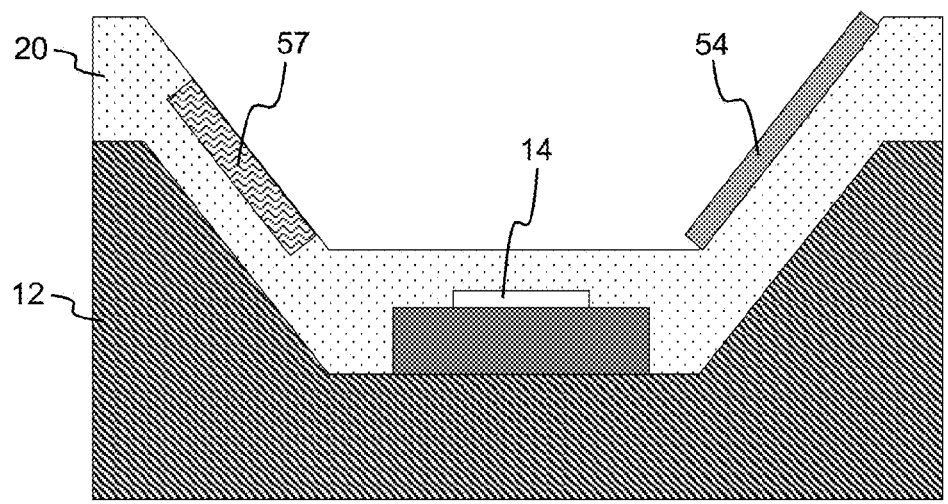
FIG. 15 shows an illustrative device package including illustrative domains according to an embodiment.

FIG. 15 shows an illustrative device package including a domain 57 formed within a transparent polymer film 20 according to an embodiment. Additionally, the device package is shown including a second domain 54 formed on the transparent polymer film 20. The domain 57 can be formed of, for example, a material that fluoresces in ultraviolet light. In this case, the domain 57 can provide a fluorescent indicator, providing a visible light indicator when the device 14 is operating. In this case, the domain 57 can be a phosphor, for example, a rare earth oxide, or similar phosphors (e.g., $Ca_5(F,Cl)(PO_4)_3$:Sb,Mn) such as those used in fluorescent lamps The domain 54 can be formed of, for example, a reflective materials, such as a thin metal layer (e.g., aluminum), and can aid in light guiding. While the domains 54, 57 are described as being formed of particular materials, it is understood that various alternative materials can be utilized. To this extent, embodiments can include both domains 54, 57 formed of the same material. Similarly, while the domain 57 is shown formed within the transparent polymer film 20 and the domain 54 is shown located on the transparent polymer film 20, it is understood that these configurations are only illustrative, and either domain 54, 57 can be formed within or located on the transparent polymer film 20.

It is understood that a device package can include any combination of domains, each of which can be included for any purpose. For example, domains, such as the domains shown in FIGS. 13 and 14, can be included to improve the light extraction from the structure. Additionally, domains can be included to manipulate the light, e.g., by directional distribution of the intensity of the light to produce a target angular distribution of light intensity. Similarly, a multilayered film structure for the encapsulating material can be utilized to improve light extraction and/or manipulate the light. For example, a multilayered film structure can be configured to reduce reflectance from the film/air boundary. A more specific embodiment can include films with graded index of refraction, which can be fabricated by properly merging films of different polymers, by introducing appropriate roughness at the film air interface, and/or the like.

Figure 16:
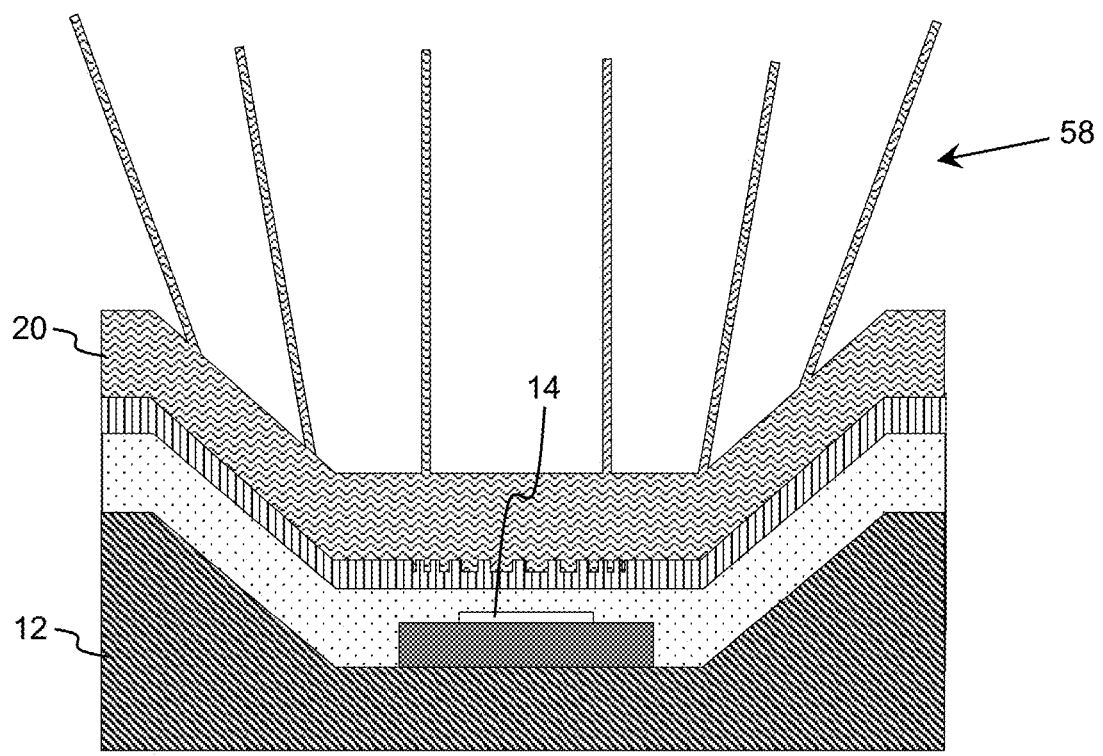
FIG. 16 shows a transparent polymer film including a plurality of protrusions according to an embodiment.

In addition to component protection and light extraction/manipulation, a transparent polymer material described herein can be configured to provide one or more additional features. For example, FIG. 16 illustrates a transparent polymer film 20 including a plurality of protrusions 58, which can be engineered to promote convective cooling thereby dissipating heat generated during operation of the optoelectronic device 14. The protrusions 58 can be fabricated using any solution, such as through the use of stamping or the like.

Figure 17A:
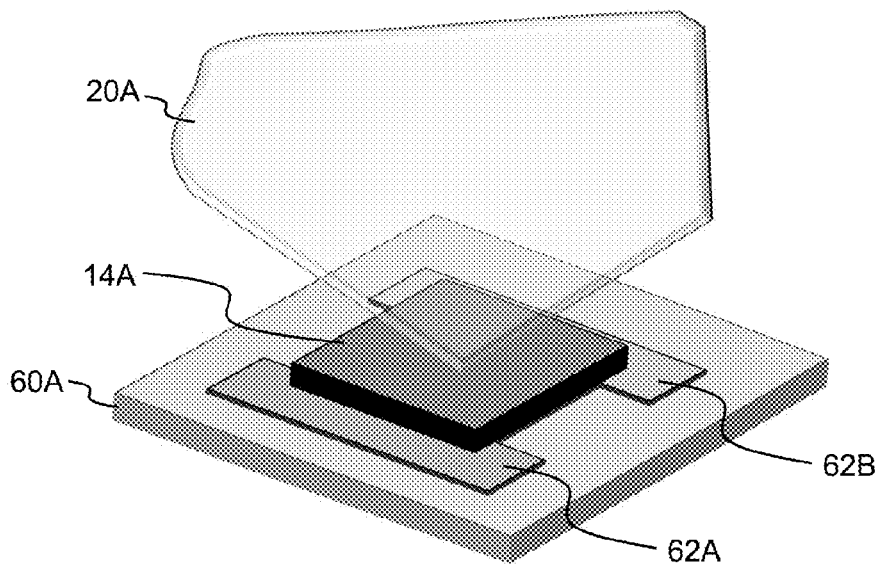
FIGS. 17A and 17B show optoelectronic devices mounted directly onto printed circuit boards according to embodiments.
Figure 17B:
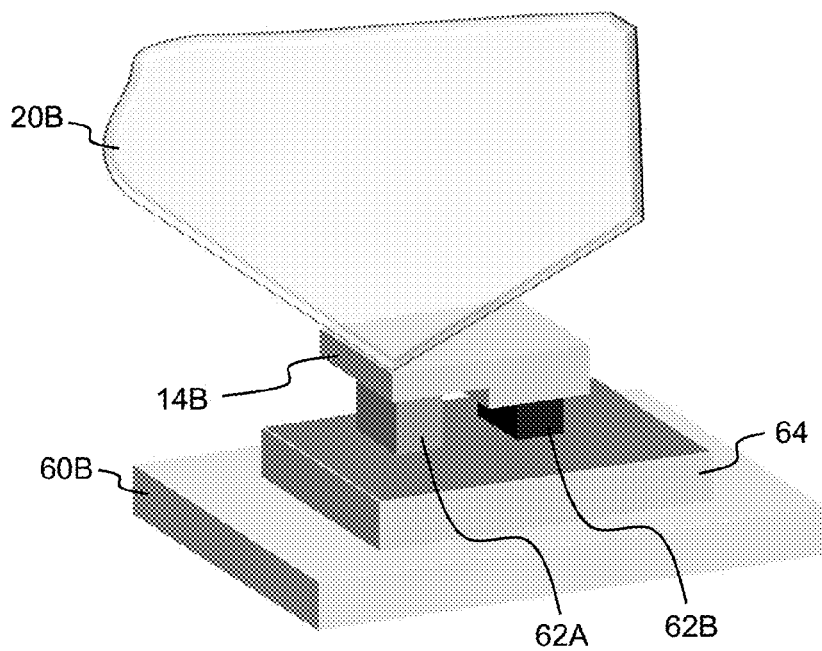

While various embodiments shown and described herein are directed to an optoelectronic device 14 surface mounted on a surface of a depression in a device package 12, it is understood that embodiments can be directed to encapsulating optoelectronic devices 14 mounted in other configurations. For example, FIGS. 17A and 17B show optoelectronic devices 14A, 14B mounted directly onto printed circuit boards (PCBs) 60A, 60B according to embodiments. Each device 14A, 14B is mounted (e.g., soldered) to the PCB 60A, 60B via contact pads 62A, 62B. A submount 64 also is used in mounting the device 14B to the printed circuit board 60B. In either case, a transparent polymer film 20A, 20B can cover the entire assembly (e.g., the device, contact pads, and submount), and subsequently processed using a solution described herein in order to encapsulate the device 14A, 14B, contact pads, 62A, 62, and/or submount 64. For example, the transparent polymer film 20A, 20B can be heated (e.g., within a heating chamber) such that it becomes flowable.

Figure 18A:
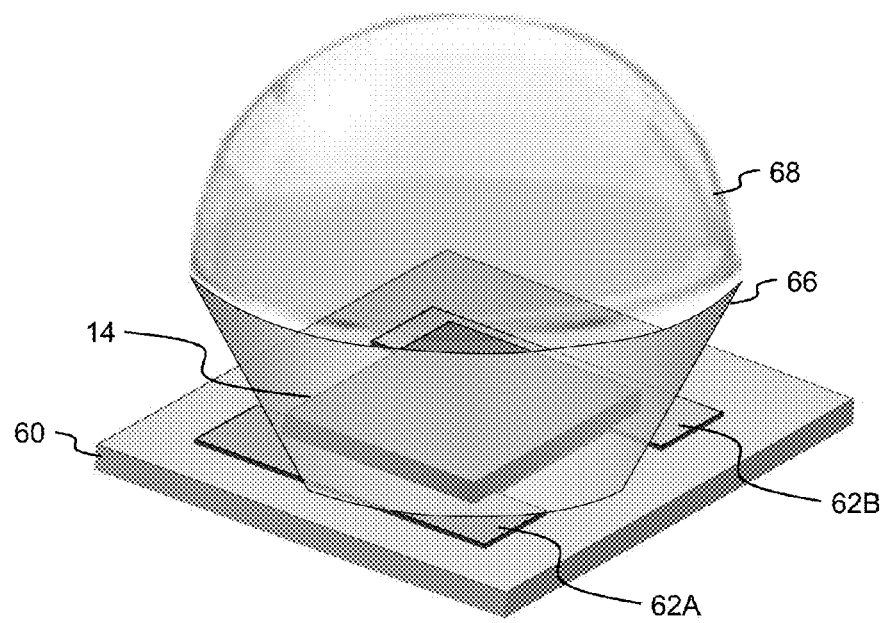
FIGS. 18A-18C show an optoelectronic device mounted directly onto a printed circuit board according to another illustrative embodiment.
Figure 18B:
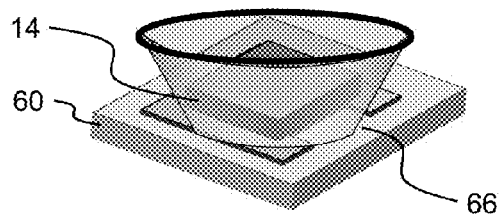
Figure 18C:
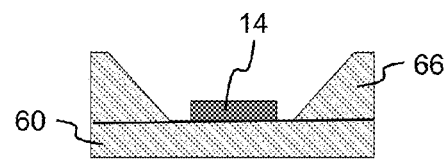

Package assemblies directly on printed circuit boards 60A, 60B also can include various features. To this extent, FIGS. 18A-18C show an optoelectronic device 14 mounted directly onto a printed circuit board 60 according to another illustrative embodiment. As shown in FIG. 18A, a reflector 66 and a lens 68 can be mounted over the optoelectronic device 14. Alternatively, as shown in FIG. 18B, only a reflector 66 can be mounted over the optoelectronic device 14. Regardless, the reflector 66 can be formed of any type of highly reflective material, such as highly polished aluminum, which can reflect approximately seventy percent of the radiation. As illustrated, the reflector 66 can comprise a conical reflector with the smaller diameter mounted directly adjacent to the device 14 on the board 60 such that the light emitted by the device 14 travels through the reflector 66. Use of the reflector 66 can alter an angular distribution of the light emitted by the device 14. The lens 68 can be formed of any suitable ultraviolet transparent material, such as sapphire, fused silica, a fluoropolymer, and/or the like. The lens 68 can be positioned over the reflector 66 or contained within a portion of the reflector 66.

As shown in FIG. 18C, a combination of the reflector 66 and the printed circuit board 60 can provide a similar cross section with respect to the device 14 as the device packaging described herein. To this extent, it is understood that the various embodiments and alternatives and their corresponding features described herein in conjunction with the device package embodiments apply equally to the printed circuit board 60 and reflector 66 embodiments. The reflector 66 can be attached to the printed circuit board 60 using a transparent polymer material and a process described herein with respect to other components. Similarly, the lens 68 can be attached to the reflector 66 using a transparent polymer material and a process described herein. The device 14 can be either wire bonded (e.g., contact leads soldered to the terminals of the device 14) or directly soldered to contacts of the board 60. Regardless, a transparent polymer material can encapsulate the device 14 as described herein.

Figure 19A:
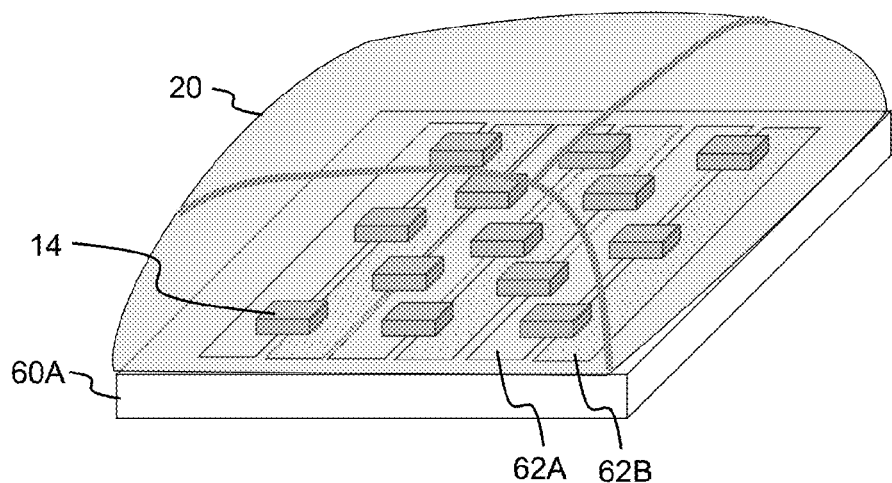
FIGS. 19A and 19B show optoelectronic devices mounted to printed circuit boards according to other illustrative embodiments.
Figure 19B:
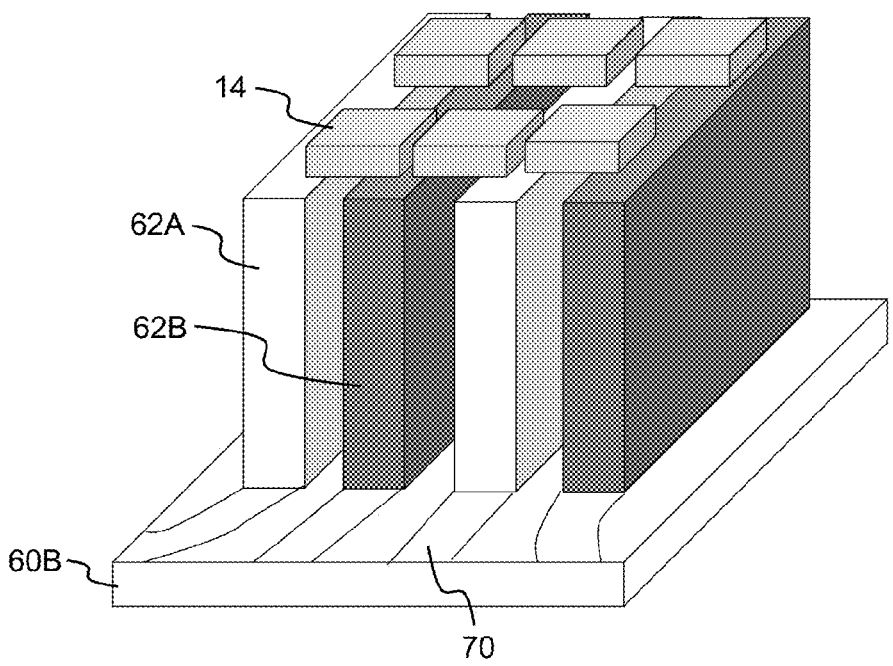

Embodiments of the present invention can include multiple devices encapsulated within a single layer of transparent material, no reflective side surfaces, and/or the like. To this extent, FIGS. 19A and 19B show optoelectronic devices 14 mounted to printed circuit boards 60A, 60B according to other illustrative embodiments. In each case, multiple devices 14 are arranged in a two dimensional pattern and are attached to the printed circuit board 60A, 60B via contacts 62A, 62B. In FIG. 19B, the contacts 62A, 62B form fins. The devices 14 can be direct flip-chip die attached to the printed circuit board 60A, 60B using any solution. The printed circuit board 60A, 60B can comprise, for example, a metal core printed circuit board. As shown in FIG. 19A, encapsulation of the devices 14 by a transparent polymer film 20 can seal the devices 14 from the environment. It is understood that a similarly configured transparent polymer film 20 can encapsulate the devices 14 shown in FIG. 19B. Such a solution can provide a dual purpose of protecting the devices 14 from the environment and for improving light extraction efficiency from the devices 14.

An embodiment of a chip assembly and fabrication process can provide for efficient heat management, as it can reduce (minimize) interfaces between the device 14 die and the ambient, e.g., by eliminating an intermediate carrier or submount and wire bonding through direct die attachment to the printed circuit board 60A, 60B. In particular, each device 14 die can be soldered to the contacts 62A, 62B such as to create a forward bias within the device 14 under an applied voltage. In an embodiment, the printed circuit board 60A, 60B is fabricated from a material having a similar thermal expansion as that of the device 14 die. To this extent, such a material can be selected by selecting a corresponding metallic alloy, selecting a material having a high thermal conductivity and a similar thermal expansion, and/or the like. Illustrative materials include ceramics, such as AlN, ceramic alumina, metal core PCB, metal core ceramic PCB, single crystal SiC, single crystal AlN, other materials or stacks of material having a low total thermal resistance between the device junction and substrate solder point, and/or the like. As used herein, a low thermal resistance can correspond to a thermal resistance in the range of 10-5° C./W or less. In an embodiment, the printed circuit board 60A, 60B can be a flexible material, such as a thin layer of stainless steel.

Regardless, it is understood that the space between contacts 62A, 62B can include a thin layer of a dielectric film and/or a gap to prevent shorting of the devices 14. For the embodiment shown in FIG. 19B, the printed circuit board 60B can be formed of a highly thermally conductive insulator, such as silicon carbide, AlN, diamond, and/or the like. In this case, electrical connection can be provided by contact pads 70. The present approach of device assembly can support roll-to-roll manufacturing production using a roll of a flexible substrate, assembly of the devices on a moving substrate, and separation of the flexible substrate into pre-assembled modules. Furthermore, an embodiment can provide packaging for a circuit or module including multiple optoelectronic devices, which can be connected and/or can communicate by electrical (e.g., wired), optical (waveguides, optical communications including visible, ultraviolet terahertz, infrared, and/or the like), and/or electromagnetic (e.g., wireless, such as microwave and radio communications) solutions.

Figure 20A:
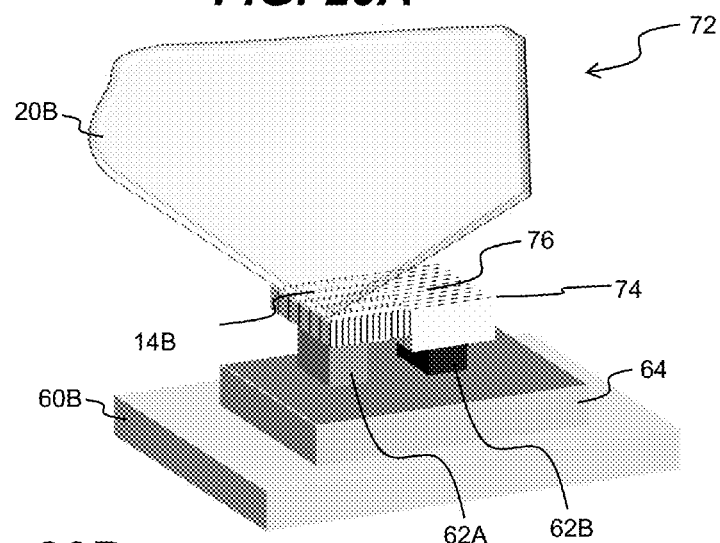
FIGS. 20A-20C illustrate the light extraction and angular distribution of light extracted from an optoelectronic device having a polished substrate and the light extraction and angular distribution of light extracted from an optoelectronic device having an unpolished substrate according to an embodiment of the present invention.
Figure 20B:
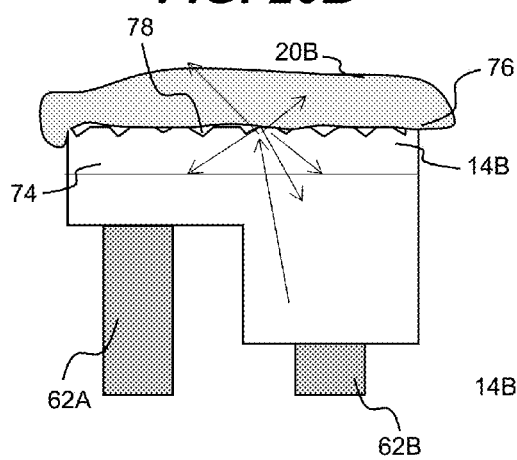
Figure 20C:
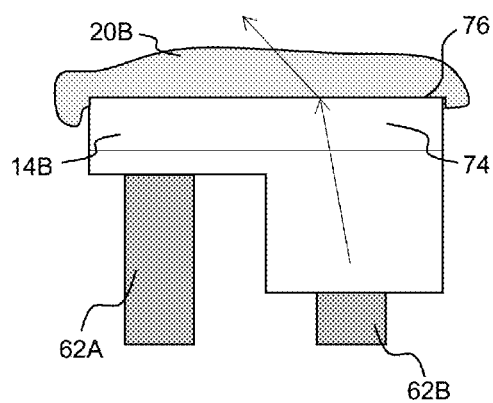

FIGS. 20A-20C illustrate the light extraction and angular distribution of light extracted from an optoelectronic device having a polished substrate and the light extraction and angular distribution of light extracted from an optoelectronic device having an unpolished substrate according to an embodiment of the present invention. In particular, FIG. 20A shows a structure 72 having an optoelectronic device 14B mounted onto a printed circuit board (PCB) 60B in a flip chip configuration. It is understood that the following embodiments are also applicable to optoelectronic devices mounted in other configurations such as, for example, optoelectronic devices mounted on a surface of a depression of a device package. In one embodiment, the optoelectronic device 14B can be mounted (e.g., soldered) to the PCB 60B via contact pads 62A, 62B and a submount 64. An ultraviolet transparent polymer material 20B, such as a transparent fluoropolymer film, can cover the entire assembly (e.g., the device, contact pads, and submount), and be subsequently processed using a solution described herein in order to encapsulate the optoelectronic device 14B, contact pads, 62A, 62B, and/or submount 64. For example, in an embodiment in which the ultraviolet transparent polymer material 20B is a transparent fluoropolymer film, the film can be heated (e.g., within a heating chamber) such that it becomes flowable.

As shown in FIG. 20A, the optoelectronic device 14B can have a substrate layer 74 with a light emitting face 76 that emits light therefrom. In one embodiment, the substrate layer 74 can include a substrate used for epitaxial growth such as, for example, sapphire, silicon carbide, aluminum nitride, gallium nitride, zinc oxide, lithium gallate, lithium niobate, diamond, silicon, and/or the like. Any of these substrates can have a roughness on the order of a micron when used as a substrate layer. When a surface containing such roughness is encapsulated by a typical ultraviolet transparent polymer material, air pockets can form, which can result in detrimental light scattering and an overall decrease in extraction efficiency of the optoelectronic device. Furthermore, the presence of such air pockets can affect the angular distribution of the emitted light.

In order to overcome these results, the optoelectronic device 14B can be polished. In the embodiment illustrated in FIG. 20A, the light emitting face 76 of the substrate layer 74 in the optoelectronic device 14B can be polished as represented by the markings applied to the light emitting face. In one embodiment, a fine polishing technique can be used to finely polish the light emitting face 76. As used herein, a "finely polished" surface means a surface polished to a roughness having length scales smaller than a characteristic wavelength of the target radiation as measured within the material. In particular, the characteristic wavelength can be fifty percent or less of the wavelength of the target radiation. For instance, considering an optoelectronic device radiating at 280 nm, the wavelength within a sapphire substrate is $280/n_{sap} \sim 280/1.82 = 155$ nm, where $n_{sap}$ is the index of refraction for sapphire. As a result, the characteristic roughness length scale can be smaller than about 80 nm.

In one embodiment, a finely polished light emitting face 76 can be obtained by using a diamond slurry with a particle size ranging from about 1 micrometer to about 10 micrometers, with a preferred particle size being about 3 micrometers. Other polishing techniques that can be used to finely polish the light emitting face 76 can include polishing with a diamond paste, sapphire polishing slurry containing alumina abrasive grain and colloidal silica, and/or the like. Any of the aforementioned polishing techniques used to finely polish the light emitting face 76 can result in a significant reduction of air pockets and other inhomogeneities at the light emitting face after encapsulation of the optoelectronic device 14B with the transparent polymer material 20B. Furthermore, any of these polishing techniques can be performed prior to semiconductor layer growth and device fabrication on the substrate 74 of the optoelectronic device 14B.

Furthermore, as illustrated in FIGS. 20B-20C, the optoelectronic device 14B that has a finely polished light emitting face 76 will have an improvement in light extraction efficiency as opposed to a device having a light emitting face that has not been finely polished. In particular, FIG. 20B shows an optoelectronic device 14B having a substrate 74 with a light emitting face 76 that has not been finely polished. As a result, air pockets 78 have formed on a surface of the light emitting face 76 after encapsulation with the transparent polymer material 20B. FIG. 20B illustrates the effect that the air pockets 78 have on the light scattering in the optoelectronic device 14B. In particular, the light scattering is more scattered throughout the optoelectronic device 14B, which causes an overall decrease in extraction efficiency of the device. On the other hand, FIG. 20C shows an optoelectronic device 14B having a substrate 74 with a light emitting face 76 that has been finely polished. As shown in FIG. 20C, no air pockets have formed on a surface of the light emitting face 76 after encapsulation with the transparent polymer material 20B. With no air pockets formed on the surface of the light emitting face 76, the light scattering of a typical ray is not scattered. This leads to an increase in extraction efficiency of the device such that there is a greater chance that the light will exit the encapsulated optoelectronic device 14B.

Figure 21:
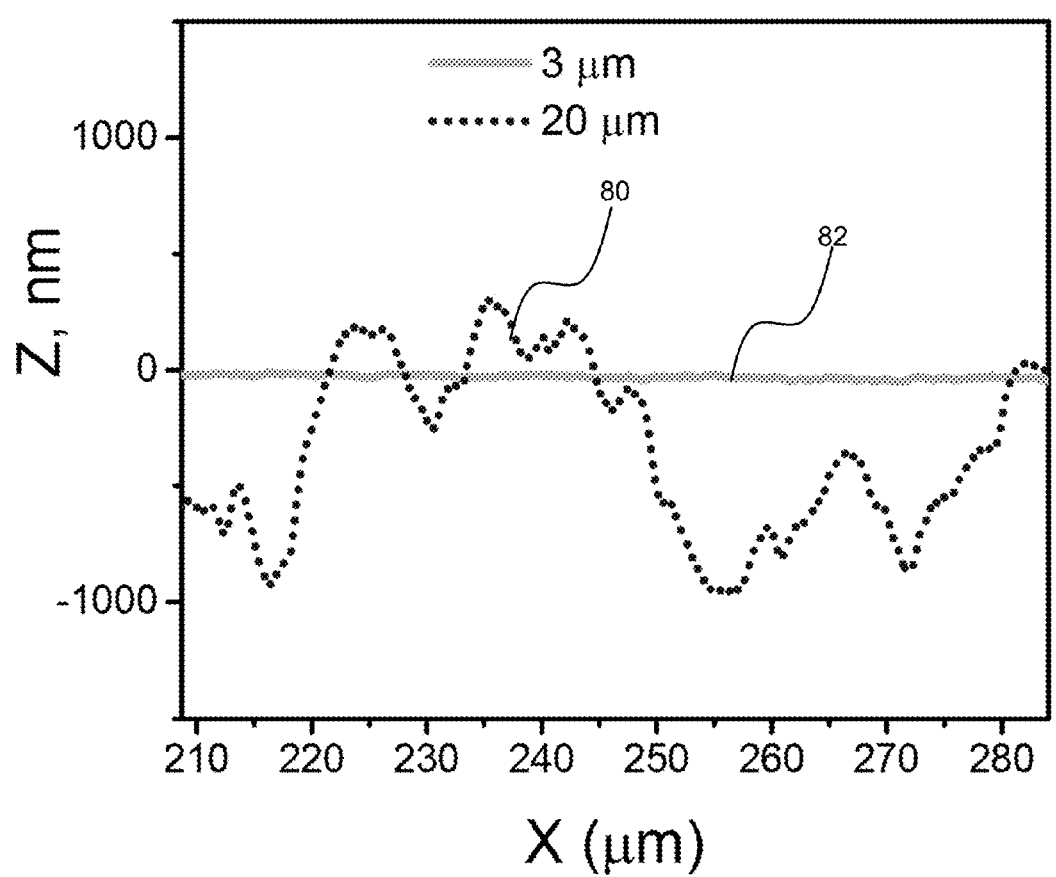
FIG. 21 illustrates an example of a roughness scale profile of a surface of an ultraviolet transparent material that is roughly polished and a roughness scale profile of a surface of an ultraviolet transparent material that is finely polished according to an embodiment of the present invention.

FIG. 21 illustrates an example of a roughness scale profile 80 of a surface of an ultraviolet transparent material that is roughly polished and a roughness scale profile 82 of a surface of an ultraviolet transparent material that is finely polished according to an embodiment of the present invention. Generally, the roughness scale profile of FIG. 21 illustrates the surface height variation in nanometers. As used here, a "roughly polished" surface means a surface having height variations comparable to or larger than the wavelength of the target radiation as measured within the material.

In the example illustrated in FIG. 21, the roughness scale profiles 80 and 82 are obtained from a sapphire substrate that has been roughly polished and from one that has been finely polished, respectively. In particular, the roughness scale profile 80 has been obtained from a sapphire substrate that has been polished with a diamond slurry using a 20 micrometer particle size, while the roughness scale profile 82 has been obtained from a sapphire substrate that has been polished with a diamond slurry using a 3 micrometer particle size. As illustrated in FIG. 21, the roughness scale profile 80 results in surface roughness variation on the order of 1 micrometer, while the roughness scale profile 82 has substantially no visible surface roughness variation in this comparison.

Figure 22:
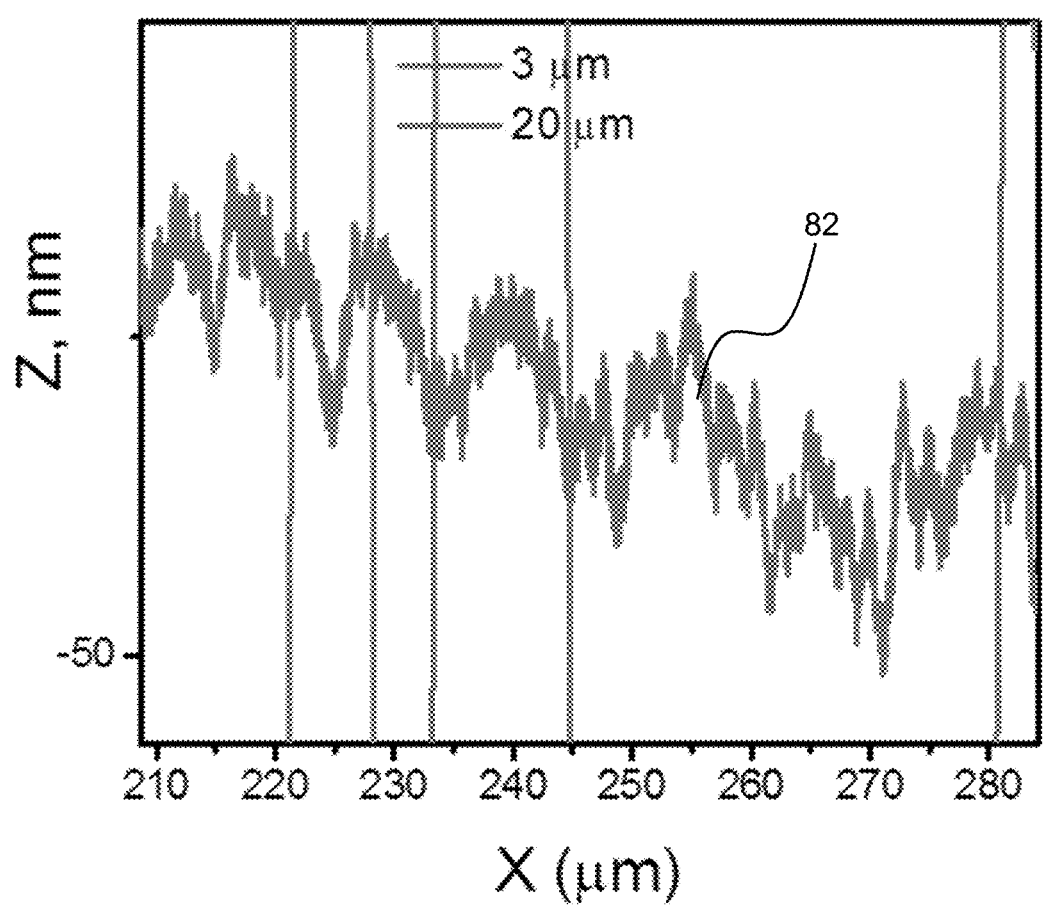
FIG. 22 shows a more detailed view of the roughness variation within the roughness scale profile of the finely polished surface depicted in FIG. 21 according to an embodiment of the present invention.

FIG. 22 shows a more detailed view of the roughness variation within the roughness scale profile of the finely polished surface 82 depicted in FIG. 21 according to an embodiment of the present invention. In particular, FIG. 22 shows a zoomed-in view of the roughness variation of the roughness scale profile 82 for the finely polished surface. As shown in FIG. 22, the characteristic roughness length scale, which corresponds to the average height of the roughness (the distance from a valley to a peak of a roughness element), is on the order of 30 nanometers. This corresponds to the order of a quarter of the wavelength of the emitted light from the optoelectronic device. Under such fine roughness the scattering is essentially not present, and thus, light extraction from the optoelectronic device is improved in comparison to a surface that has not been polished, and even to a surface that has been roughly polished.

It is understood that polishing reduces the presence of roughness on the scale that is comparable to one or fewer wavelengths of the light that is emitted from an optoelectronic device. Large roughness variations on the scale of tens of wavelength can be advantageous provided that the encapsulant is capable of filling these roughness elements without resulting in any air pockets formed between the roughness elements on the light emitting face of the substrate and the encapsulant.

Figure 23:
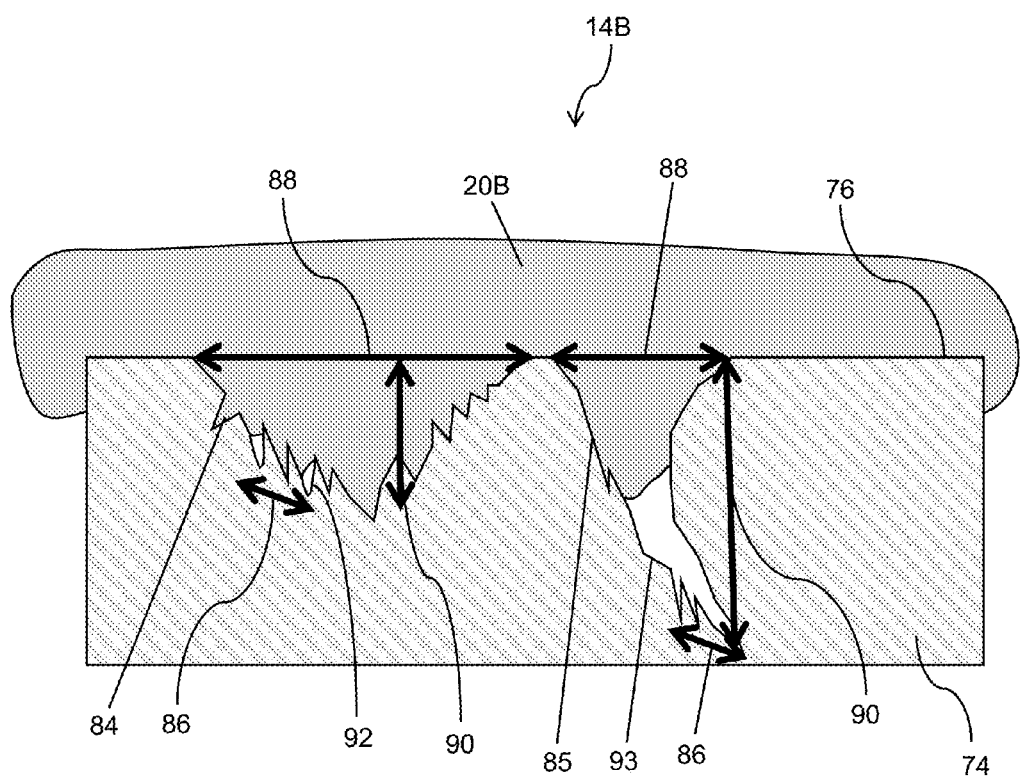
FIG. 23 illustrates an example of a surface of a substrate of an optoelectronic device having roughness elements of different shapes and sizes with an encapsulant filled thereon according to an embodiment of the present invention.

FIG. 23 illustrates an example of a surface of a light emitting face 76 of a substrate 74 of an optoelectronic device 14B with roughness elements of different shape and size that are present after polishing the substrate. In FIG. 23, there are two roughness elements 84 and 85. Each of these roughness elements can be distinguished by several characteristic roughness length scales that describe certain features of the roughness elements. A first characteristic roughness length scale is a scale of roughness 86 which provides an indication of the degree of surface roughness associated with the roughness elements over a high spatial frequency level. Specifically, it can provide the characteristic distance between a valley and a peak of roughness 84. A second characteristic roughness length scale is a characteristic width 88 of the roughness element. A third characteristic roughness length scale is a characteristic depth 90 of the roughness element.

As shown in FIG. 23, the ultraviolet transparent material or encapsulant 20B fills each roughness element with the exception of the small domains 92 in roughness element 84 and the larger domain 93 in the roughness element 85. In order to satisfactory fill such domains it is desirable for the domains to have a size that is under the wavelength of the emitted light that is emitted from the optoelectronic element 14B. In one embodiment, it is preferable to have the domains be substantially smaller than the wavelength of the emitted light. In a preferred embodiment, the domains should be no larger than 10 nanometers. If the only voids associated with the domains are within this range, then the encapsulant 20B will substantially fill the roughness elements during the encapsulation of the optoelectronic device 14B. As used herein, substantially filling the roughness elements means completely filling most of the roughness elements with the material. An interface including roughness elements (e.g., voids) can be considered to be substantially filled by an encapsulant when at least 90% of the lateral area of the interface comprises an interface between only two materials, e.g., the substrate material and the encapsulant, and does not contain additional interfaces associated with a gas, e.g., a substrate/gas interface and/or a gas/encapsulant interface. In the example illustrated in FIG. 23, the domains 92 in roughness element 84 is in the above range that ensures that the roughness element 84 will be substantially filled, while domain 93 in roughness element 85 is not in the range, and thus, is not substantially filled with the encapsulant 20B.

In an embodiment of the present invention, the aforementioned characteristic roughness length scales can be used as roughness parameters for a polishing operation of the light emitting face 76, such that these parameters can be selected to ensure that the filling of the encapsulant 20B on the optoelectronic device 14B fills any roughness elements formed on the light emitting face 76 without having any air pockets. One roughness parameter can be the characteristic roughness length scale. In one embodiment, the polishing operation can be set to obtain roughness elements that are less than the operating radiation wavelength of light emitted from the light emitting face. In another embodiment, the polishing operation can be set to obtain roughness elements that are less than two-thirds of the wavelength of light emitted from the light emitting face. In either embodiment, having such a specified roughness parameter will ensure that any roughness elements that result from the polishing operation are substantially filled with the ultraviolet transparent polymer material or encapsulant.

Another roughness parameter can be the characteristic roughness width scale. In one embodiment, the polishing operation can be set to obtain roughness elements with a characteristic roughness width scale having a range of about 1 nanometers to about 100 nanometers. In this manner, having a roughness parameter that specifies the polishing operation obtain roughness elements with a characteristic roughness width scale ranging from about 1 nanometers to about 100 nanometers will ensure that any such roughness elements are substantially filled with the ultraviolet transparent polymer material or encapsulant.

A third roughness parameter can be a ratio of the characteristic width of roughness of a roughness element to a characteristic depth of roughness of the roughness element. In one embodiment, the polishing operation can be set to obtain roughness elements with a ratio of the characteristic width of roughness to a characteristic depth of roughness that satisfies a predetermined threshold that allows substantial filling with the ultraviolet transparent polymer material. It is understood that this predetermined threshold can be set by measuring optical emission from the device, ensuring that most of the emitted light does not undergo scattering. For instance, the measurement of the polishing and subsequent filling of the substrate can be accomplished by focusing a laser beam on the interface between the filler and substrate material and measuring the scattering of the laser beam. If the scattering of the laser beam is less than, for example, 10%, then the interface is sufficiently filled. In this manner, characteristic widths of roughness and characteristic depths of roughness can be selected to satisfy the predetermined threshold. Thus, the polishing operation can be set to obtain chosen characteristic polishing widths of roughness and characteristic polishing depths of roughness that satisfy the predetermined ratio threshold, which will ensure that any such roughness elements are substantially filled with the ultraviolet transparent polymer material or encapsulant. In the event, that the chosen polishing widths of roughness and characteristic polishing depths of roughness do not satisfy the predetermined threshold, then other values can be selected that will satisfy the threshold.

In one embodiment, the width and depth can be selected such that if the width is larger than a predetermined threshold for a ratio of width for a given depth, then encapsulant will substantially fill the roughness element. Otherwise, it will not substantially fill the roughness element. It is understood that depending on the shape of the roughness element, a target range of width that is used to form the threshold for substantial filling with the encapsulant can be determined. It is further understood, that satisfactory values for the characteristic width of roughness and the characteristic ratio of width to depth of roughness will depend on the physical parameters of the encapsulant such as the viscosity and surface tension of the encapsulant. In general, these physical parameters should be determined for each type of encapsulating material used to encapsulate the optoelectronic device 14B.

In FIG. 23, roughness element 84 is an example of a roughness element having a characteristic width of roughness and a ratio of the characteristic width of roughness to a characteristic depth of roughness that can ensure substantially complete encapsulation with only small domains 92, while roughness element 85 is an example of a roughness element that cannot be completely encapsulated, hence the presence of the large domain 93 that is not encapsulated.

While illustrative aspects of the invention have been shown and described herein primarily in conjunction with a device package for an optoelectronic device and a method of fabricating such a device package, it is understood that aspects of the invention further provide various alternative embodiments.

Figure 24:
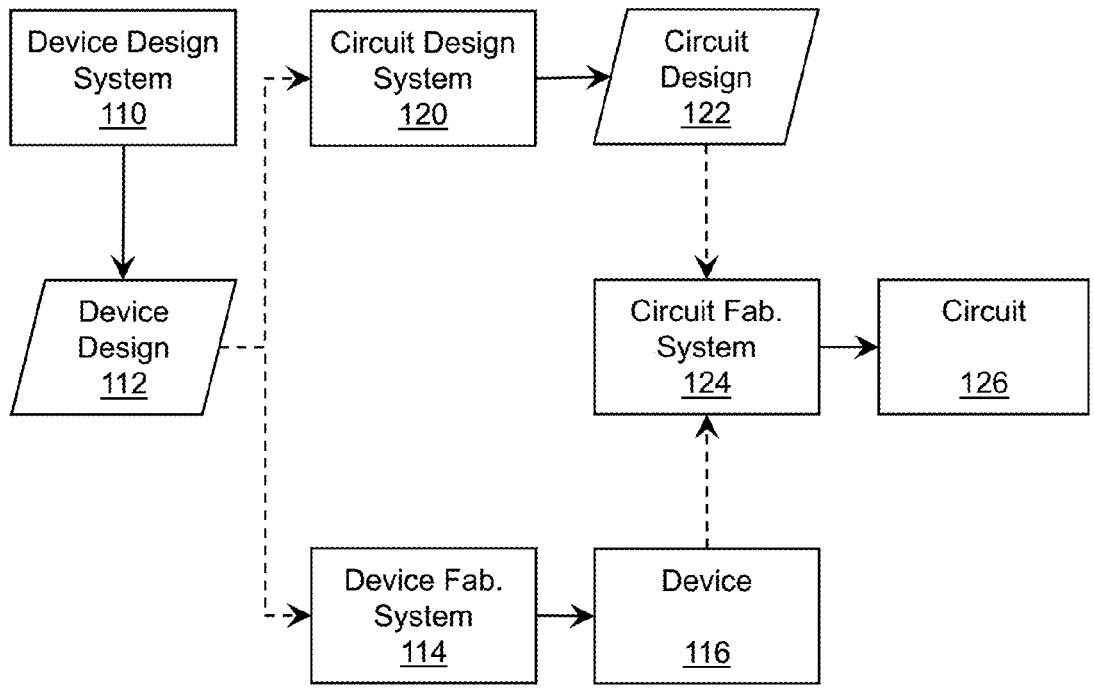
FIG. 24 shows an illustrative flow diagram for fabricating a circuit according to an embodiment.

In one embodiment, the invention provides a method of designing and/or fabricating a circuit that includes one or more of the packaged devices designed and fabricated as described herein. To this extent, FIG. 24 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112.

To this extent, the device fabrication system 114 can include a temperature and/or pressure chamber, which can be utilized to facilitate adhesion between the transparent polymer material and the device and/or the device package as described herein. Furthermore, the device fabrication system 114 can include a stamp tool, which can be operated to apply pressure between the transparent polymer material and the device and/or device package. Still further, the device fabrication system 114 can include other components, such as a local heat source (e.g., a laser), a local vacuum source, a cutting tool, a light source, a chemical source, and/or the like, each of which can be operated to perform one or more actions described herein.

The device fabrication system 114 can include a computer system, which is programmed to automatically or semi-automatically operate the various components in order to perform a device packaging process described herein. It is understood that various alterations can be made to a general device packaging process, e.g., based on the materials being utilized. For example, certain polymers may require an optimal heating and cooling schedule, which can be a complex function of time and space. For spatial-temporal resolution, the device fabrication system 114 can include a heating laser operated by the programmed computer system. In another embodiment, the computer system of the device fabrication system 114 can operate the heating in a pulsed mode, which can vary in time when a stack of films is applied to package the device. Regardless, the computer system can optimally correlate the heating with the process of application of vacuum for a process utilizing a vacuum chamber as described herein.

Figure 25:
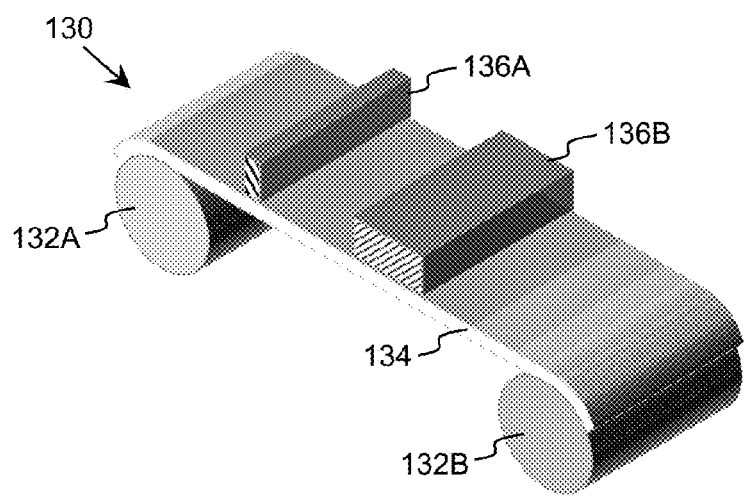
FIG. 25 shows an illustrative portion of a roll-to-roll device fabrication system according to an embodiment.

In an embodiment, devices described herein can be flexible and the device fabrication system 114 can utilize a roll-to-roll fabrication process. For example, FIG. 25 shows an illustrative portion of a roll-to-roll device fabrication system 130 according to an embodiment. As illustrated, the roll-to-roll device fabrication system 130 can include two rolls 132A, 1326, over which a flexible device heterostructure 134 travels during the fabrication process. The flexible device heterostructure 134 can make several passes over the rolls 132A, 132B, e.g., as the layers of the device are being fabricated. The flexible device heterostructure 134 can include multiple individual devices being concurrently fabricated. For example, the individual devices can be laid out in a two-dimensional array on the flexible device heterostructure 134.

As discussed herein, fabrication of a device can include the utilization of a stamp tool. To this extent, the roll-to-roll device fabrication system 130 is shown including a pair of illustrative stamp tools 136A, 136B. During a pass of the flexible device heterostructure 134 one or both of the stamp tools 136A, 136B can impact the flexible device heterostructure 134 to imprint a desired shape onto the layer(s). For example, the stamp tool 136A can be operated as shown and described in conjunction with the stamp tool in FIGS. 7A-7C. As the flexible device heterostructure 134 can include multiple devices in a row, the stamp tool 136A can include a corresponding number of substantially identical individual stamp imprints, which can be concurrently applied to the row of devices. Similarly, the stamp tool 136B can include a two dimensional array of substantially identical individual stamp imprints, which can be concurrently applied to a two dimensional array of devices located on the flexible device heterostructure 134.

It is understood that inclusion of two stamp tools 136A, 136B is only illustrative and a roll-to-roll device fabrication system 130 can include any number of stamp tools 136A, 136B. Each such stamp tool 136A, 136B can include a different pattern to be imprinted onto the flexible device heterostructure 134 at a different point in time during the fabrication of the devices. For example, using the device package shown in FIG. 14, a stamp tool can be utilized after deposition of the layer 20B to form the domain 56 and a different stamp tool can be utilized after deposition of the layers 20A, 20C. Furthermore, it is understood that a stamp tool may not be utilized on the flexible device heterostructure 134 each pass over the rolls 132A, 132B. For example, again considering the device package shown in FIG. 14, no stamp tool may be utilized as the flexible device heterostructure 134 passes after deposition of the domains 52A, 52B.

Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of packaging a set of optoelectronic devices mounted on a device package, the method comprising:

polishing a light emitting face of a substrate of each of the set of optoelectronic devices, wherein a polished light emitting face of a corresponding optoelectronic device in the set of optoelectronic devices has a characteristic roughness length scale that is smaller than an ultraviolet operating radiation wavelength for the corresponding optoelectronic device as measured within the substrate;

placing an ultraviolet transparent polymer material adjacent to the polished light emitting face of each optoelectronic device in the set of optoelectronic devices, wherein the ultraviolet transparent polymer comprises a fluoropolymer having a thickness between 100 microns and 3 millimeters;

processing the ultraviolet transparent polymer material to adhere to the polished light emitting face and seal each optoelectronic device in the set of optoelectronic devices from an ambient environment; and attaching a wave guiding structure over the ultraviolet transparent polymer material, wherein the attaching of the wave guiding structure over the ultraviolet transparent polymer material comprises heating the ultraviolet transparent polymer material to become flowable, wherein the wave guiding structure partially submerges into the ultraviolet transparent polymer material, wherein the wave guiding structure is physically attached with the ultraviolet transparent polymer.

2. The method of claim 1, wherein the attaching of the wave guiding structure over the ultraviolet transparent polymer material comprises forming a plurality of separate lenses, each of the separate lenses formed over one of the optoelectronic devices in the set of optoelectronic devices.

3. The method of claim 1, wherein the attaching of the wave guiding structure over the ultraviolet transparent polymer material comprises forming a plurality of interconnected lenses over all of the optoelectronic devices in the set of optoelectronic devices, and wherein the plurality of interconnected lenses are formed from the ultraviolet transparent polymer material.

4. The method of claim 1, wherein the attaching of the wave guiding structure over the ultraviolet transparent polymer material comprises forming a single lens that extends over each of the optoelectronic devices in the set of optoelectronic devices and the device package.

5. The method of claim 1, wherein the wave guiding structure comprises an optical fiber that attaches to each of the optoelectronic devices through the ultraviolet transparent polymer material.

6. The method of claim 5, wherein each of the optoelectronic devices is configured to emit ultraviolet radiation at a different peak wavelength, and wherein the ultraviolet radiation of different peak wavelengths is coupled to the optical fiber.

7. The method of claim 1, wherein the attaching of the wave guiding structure over the ultraviolet transparent polymer material comprises applying an adhesive material to at least one of: the wave guiding structure or the ultraviolet transparent polymer material, wherein the wave guiding structure adheres to the ultraviolet transparent polymer material.

8. The method of claim 1, wherein the ultraviolet transparent polymer material comprises a thickness that varies over each of the optoelectronic devices.

9. The method of claim 1, wherein the wave guiding structure comprises an external structure coupled to the device package, wherein the external structure comprises one of: an enclosure or an ultraviolet transparent wave guiding structure.

10. The method of claim 1, wherein the ultraviolet transparent polymer material comprises a plurality of discontinuous portions, wherein each discontinuous portion of the ultraviolet transparent polymer material attaches to a different region of the wave guiding structure.

11. The method of claim 10, further comprising applying a binding media between at least two of the discontinuous portions of the ultraviolet transparent polymer material.

12. The method of claim 11, wherein the binding media is selected from the group consisting of: a fusable metallic alloy, a surface activated bonding material, an atomic diffusion bonding material, a flowable oxide, a liquid deposited adhesive, and a curing adhesive.

13. The method of claim 1, wherein the ultraviolet transparent polymer material extends continuously over a top surface of each optoelectronic device and wraps around to each side surface thereof to cover a portion of each side.

14. The method of claim 1, wherein the wave guiding structure comprises a total internal reflection (TIR) lens positioned over each optoelectronic device in the set of optoelectronic devices and the device package.

15. An optoelectronic device, comprising:
a device package having a cavity formed therein;
an optoelectronic component mounted within the cavity of the device package, the optoelectronic component having a top surface with a characteristic roughness length scale that is smaller than an ultraviolet operating radiation wavelength for the corresponding optoelectronic device as measured within a material forming the top surface;
an ultraviolet transparent polymer material formed over the optoelectronic component and the device package, the ultraviolet transparent polymer material extending over the optoelectronic component and the device package, wherein the ultraviolet transparent polymer material contacts only the top surface of the optoelectronic component and only a top surface of the device package that surrounds the optoelectronic component, the ultraviolet transparent polymer material adhering to the top surface of the optoelectronic component and sealing the optoelectronic component and the cavity from an ambient environment; and
a wave guiding structure formed over the ultraviolet transparent polymer material and the device package, wherein the wave guiding structure includes an optical fiber extending along all of a top surface of the ultraviolet transparent polymer material.

16. The optoelectronic device of claim 15, wherein the ultraviolet transparent polymer material is bonded to the top surface of the optoelectronic component and the top surface of the device package.

17. The optoelectronic device of claim 15, wherein the ultraviolet transparent polymer material is physically attached to the top surface of the optoelectronic component and the top surface of the device package.

18. A method of packaging an optoelectronic device, the method comprising:
placing an ultraviolet transparent polymer film across a device package on which an optoelectronic device is mounted, wherein the ultraviolet transparent polymer film comprises a fluoropolymer;
encapsulating the optoelectronic device with the ultraviolet transparent polymer film, wherein the ultraviolet transparent polymer film substantially fills any voids present on an emitting surface of the optoelectronic device, wherein the emitting surface has a characteristic roughness length scale that is smaller than an ultraviolet operating radiation wavelength for the corresponding optoelectronic device as measured within a material forming the emitting surface, and wherein the ultraviolet transparent polymer film and the device package seal a portion of the optoelectronic device from an ambient environment; wherein the encapsulating includes:
heating the ultraviolet transparent polymer film to become flowable;
monitoring the ultraviolet transparent polymer film to determine when the ultraviolet transparent polymer film has flowed sufficiently;
applying a pressure to the ultraviolet transparent polymer film and the device package after sufficient flow has occurred;
expunging air from the device package as the pressure is applied and the ultraviolet transparent polymer film adheres to at least a portion of the device package and at least a portion of the optoelectronic device; and
allowing the ultraviolet transparent polymer film to cure; and
attaching a wave guiding structure over the ultraviolet transparent polymer material, wherein the wave guiding structure partially submerges into the ultraviolet transparent polymer material, wherein the wave guiding structure is physically attached with the ultraviolet transparent polymer.

19. The optoelectronic device of claim 15, wherein the optical fiber is coupled to a plurality of adjacent optoelectronic devices to form a set of interconnected optoelectronic devices.

20. The method of claim 19, wherein each of the optoelectronic devices in the set of interconnected devices is configured to emit ultraviolet radiation at a different peak wavelength, and wherein the ultraviolet radiation of different peak wavelengths are coupled to the optical fiber.

* * * * *